United States Patent
Guldi et al.

(10) Patent No.: US 6,967,110 B2
(45) Date of Patent: Nov. 22, 2005

(54) SENSITIVE TEST STRUCTURE FOR ASSESSING PATTERN ANOMALIES

(75) Inventors: Richard L. Guldi, Dallas, TX (US);
Howard Tigelaar, Allen, TX (US);
Anand Reddy, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/438,651

(22) Filed: May 15, 2003

(65) Prior Publication Data

US 2004/0229388 A1 Nov. 18, 2004

(51) Int. Cl.[7] .............................................. H01L 21/00
(52) U.S. Cl. .............................................. 438/11; 438/5
(58) Field of Search .................................. 438/11, 52, 5, 438/10, 14, 17, 18

(56) References Cited

U.S. PATENT DOCUMENTS

| | | | |
|---|---|---|---|
| 4,978,908 | A | 12/1990 | Mahant-Shetti et al. |
| 5,159,752 | A | 11/1992 | Mahant-Shetti et al. |
| 6,303,395 | B1 * | 10/2001 | Nulman ........................ 438/14 |
| 6,429,667 | B1 | 8/2002 | Ausschnitt et al. |
| 6,623,992 | B1 * | 9/2003 | Haehn et al. .................. 438/11 |
| 2003/0006413 | A1 | 1/2003 | Chawla et al. |
| 2003/0020917 | A1 | 1/2003 | Mundt et al. |

OTHER PUBLICATIONS

"Testing Integrated circuit microstructures using charging–induced voltage contrast", T.J. Aton, S. S. Mahant–Shetti, R. J. Gale, M. H. Bennett–Lilley, M. G. Harward, C. A. Pico and T. L. Weaver, American Vacuum Society Technol. B 8 (6), Nov./Dec. 1990, pp. 2041–2044.

* cited by examiner

*Primary Examiner*—Lynne A. Gurley
*Assistant Examiner*—Andre' Stevenson
(74) *Attorney, Agent, or Firm*—Yingsheng Tung; Wade James Brady, III; Frederick J. Telecky, Jr.

(57) ABSTRACT

A subset test module and associated methodology for utilizing the same are disclosed that facilitate identification of process drift in semiconductor fabrication processing. A test wafer having a plurality of die formed thereon has a plurality of test modules formed within the die. The plurality of test modules are substantially the same from die to die, and the respective modules similarly include a plurality of test structures that are substantially the same from module to module. Corresponding test structures within respective modules on different die are inspected and compared to one another to find structures that are sensitive to process drift. One or more structures that experience differences from module to module on different die are utilized to develop one or more test modules that can be selectively located within production wafers and monitored to determine whether process drift and/or one or more other aberrant processing conditions are occurring.

15 Claims, 19 Drawing Sheets

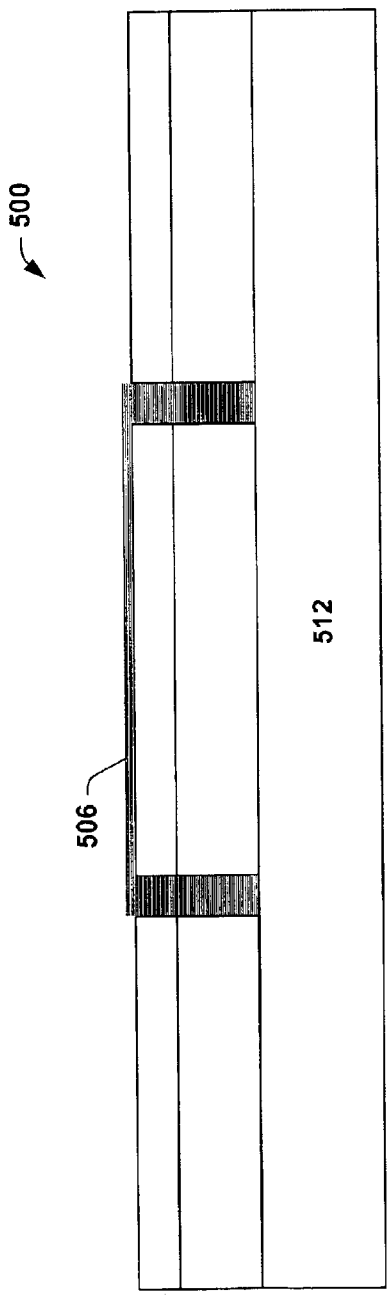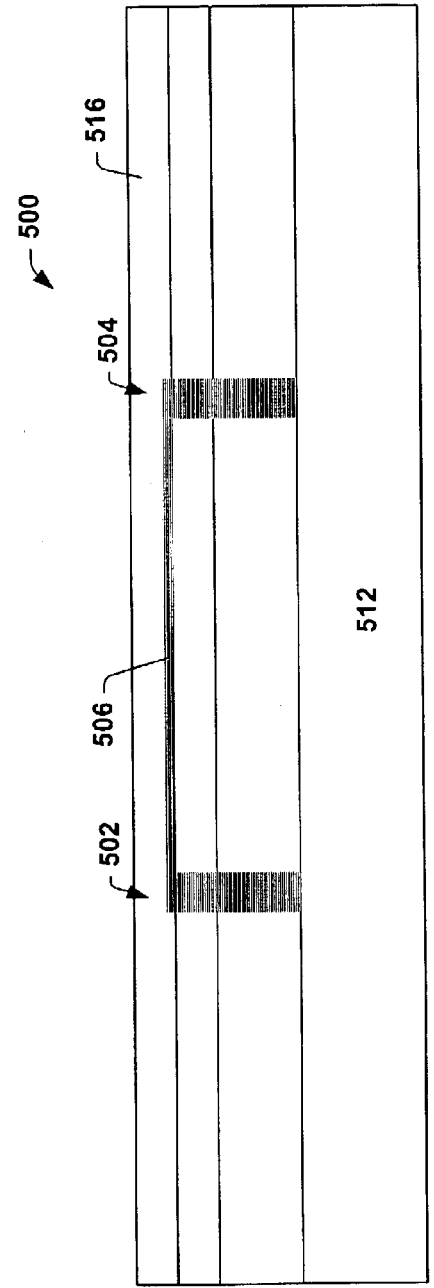

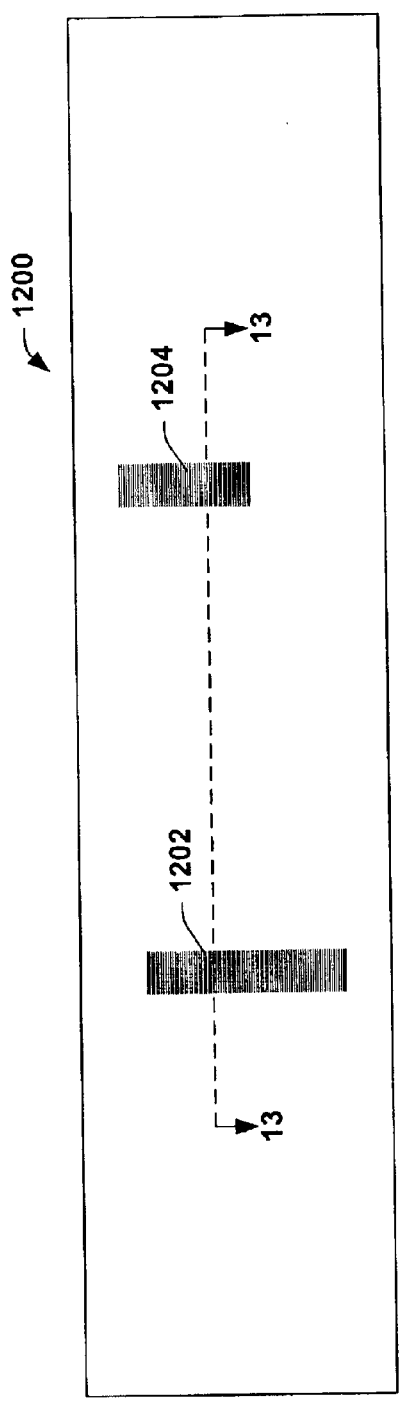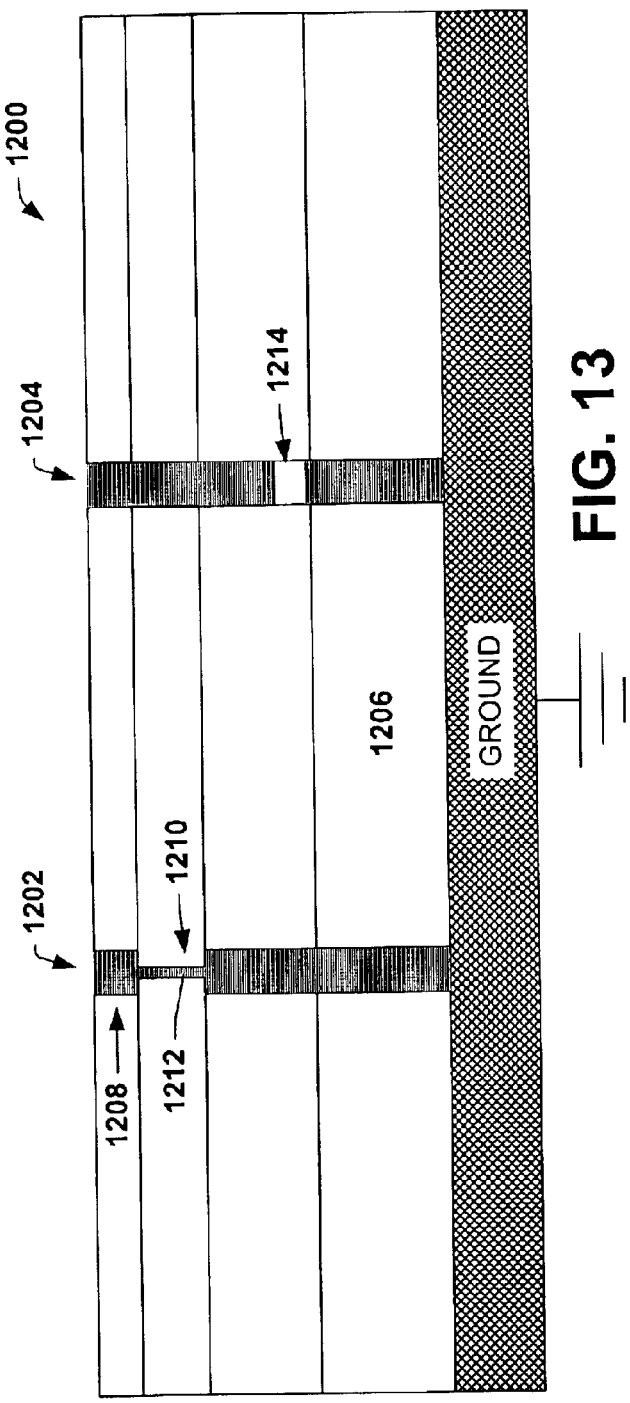

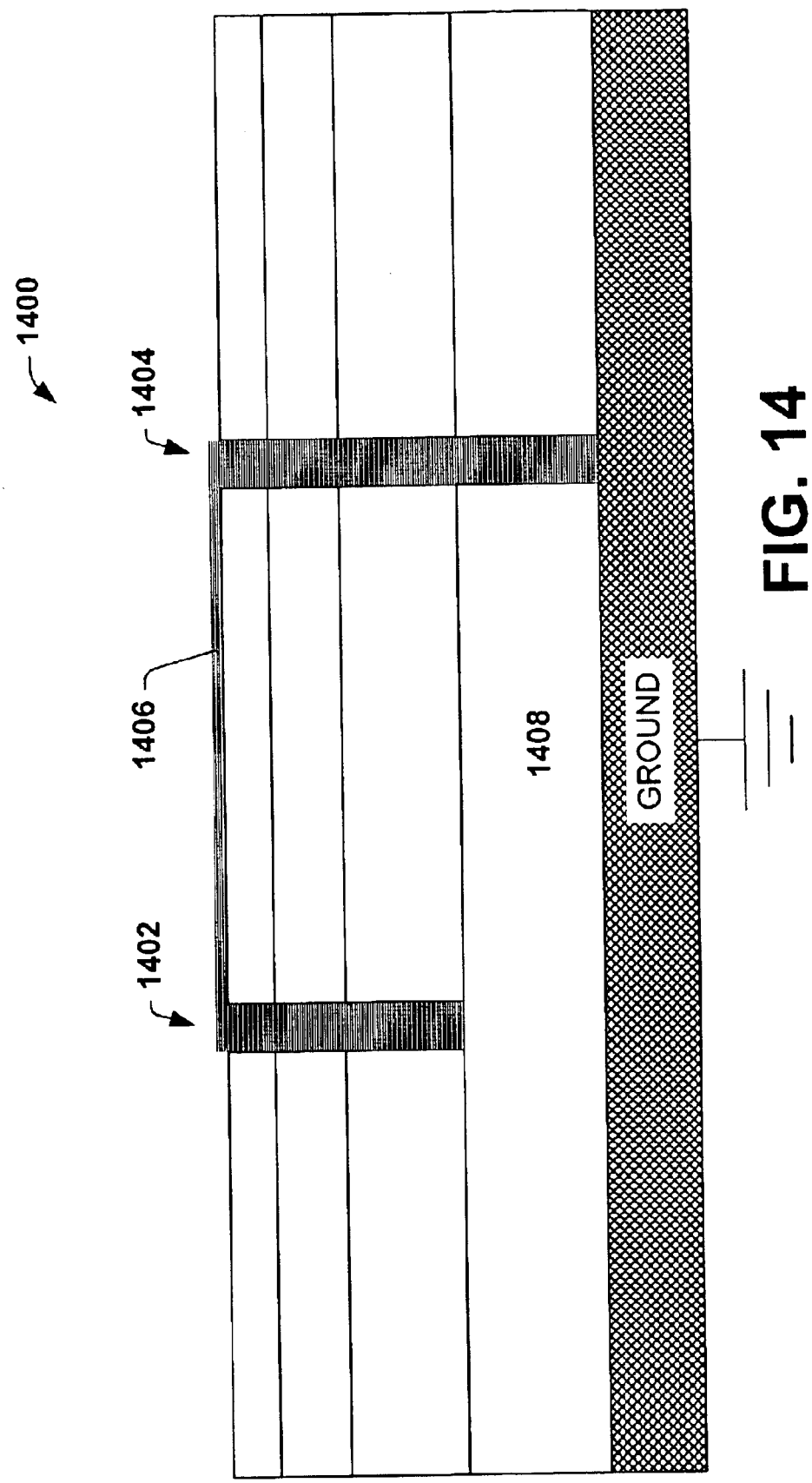

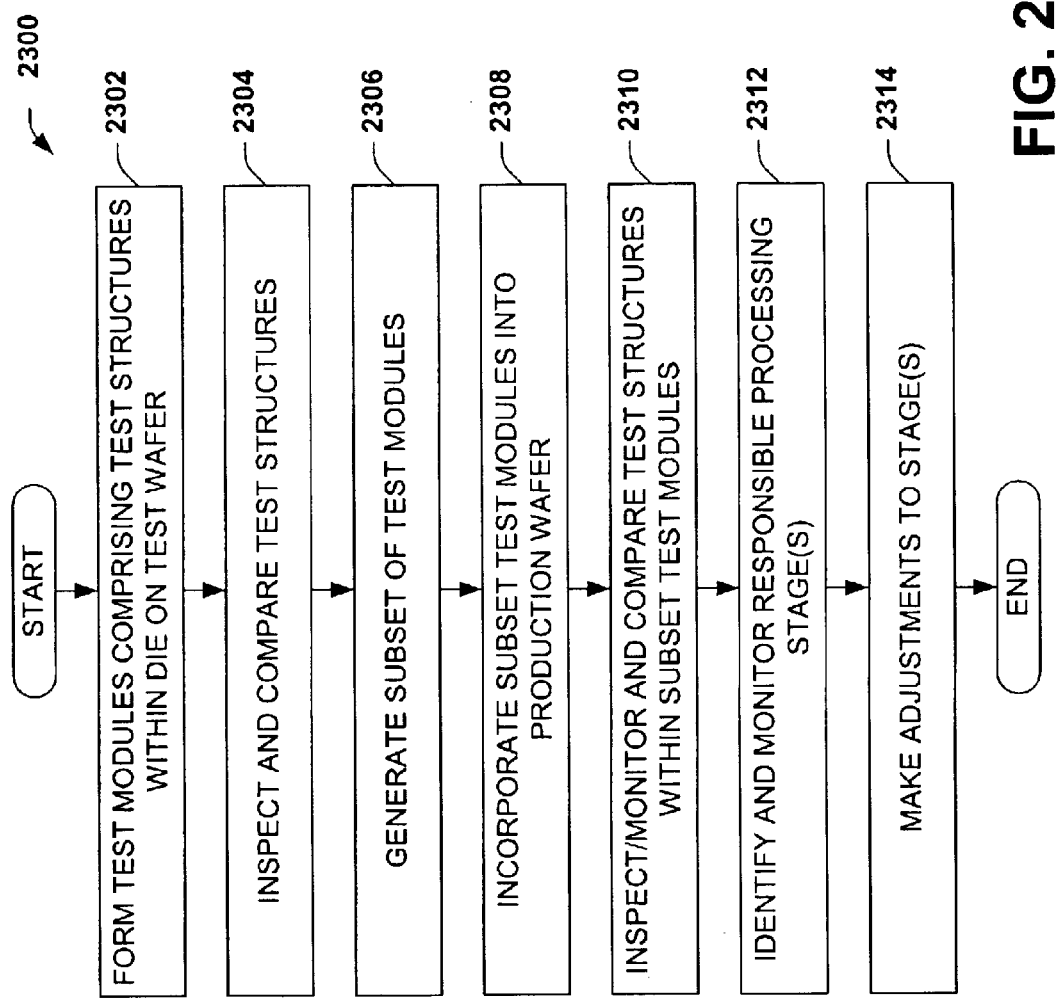

SENSITIVE TEST STRUCTURE FOR ASSESSING PATTERN ANOMALIES

FIELD OF INVENTION

The present invention relates generally to semiconductor technologies and more particularly to a test structure and methodology for developing and utilizing the same to detect process drift and/or pattern anomalies in semiconductor processing.

BACKGROUND OF THE INVENTION

The widespread proliferation of computers and electronic devices is continually increasing as computers are consistently being used for different and more sophisticated applications. For example, the growth and use of digital media (e.g., digital audio, video, images, and the like) has expanded the use of computers, as well as the volume and complexity of functionality needed to be supported by these devices. Likewise, new and improved electronic devices (e.g., digital audio players, video players) are continually being developed and are placing new and ever increasing demands on the technology behind these devices. This growth and development has vastly increased the processing and storage needs for computer and electronic devices, as well as the desire to produce these devices in a manner that allows such devices to be made available to consumers at affordable prices.

Accordingly, in the semiconductor industry, there is a continuing trend toward higher densities, throughput and yield. To achieve high densities, there has been and continues to be efforts toward scaling down dimensions (e.g., at submicron levels) on semiconductor wafers, which are generally produced from bulk silicon. In order to accomplish such high packing densities, smaller feature sizes and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The dimensions of features and the spacing therebetween can be referred to as critical dimensions (CDs). Reducing CDs, and reproducing more accurate CDs facilitates achieving higher densities through scaled down dimensions and increased packing densities. To increase throughput, the number of required processing steps can be reduced and/or the time required to perform those processing steps can be reduced. To increase yield, which is the percentage of finished products that leave a fabrication process as compared to the volume of raw materials that enter the fabrication process, quality control over individual fabrication processes can be improved.

In semiconductor fabrication a wafer is entered into a processing chamber and exits from the chamber with hundreds of copies (or more) of one or more features formed onto the wafer, and more particularly onto respective die of the wafer. During the fabrication process the wafer may be subjected to hundreds of steps that may include, for example, layering, doping, heat treating, patterning, deposition, growth, alignment, illumination, exposure, magnification/de-magnification, focusing, baking, developing, etching, patterning, implanting, polishing, reacting, and others, by which one or more transistors and/or other electrical devices are formed and interconnected on die on the wafer.

By way of example, multiple iterations of manipulating thin films may be performed to create several patterned layers on and into a substrate of the wafer. Layering is an operation that adds thin layers to the wafer surface. Layers can be, for example, insulators, semiconductors and/or conductors and are grown or deposited via a variety of processes. Common deposition techniques include, for example, CVD, sputtering and/or electroplating. Doping is another operation wherein a specific amount of dopants are selectively added to the wafer. The dopants can cause the properties of layers to be modified (e.g., change a semiconductor to a conductor). A number of techniques, such as thermal diffusion and ion implantation can be employed for doping. Heat treatments are another basic operation in which a wafer is heated and cooled to achieve specific results. Typically, in heat treatment operations, no additional material is added or removed from the wafer, although contaminants and vapors may evaporate from the wafer. One common heat treatment is annealing, which activated dopants and repairs damage to the crystal structure of a wafer/device generally caused by doping operations. Other heat treatments, such as alloying and driving of solvents, are also employed in semiconductor fabrication.

By performing these steps, the fabrication process selectively forms desired structures or features at specific locations in and on die of the wafer. These structures or features may comprise, for example, electrically active regions of integrated circuits formed on the wafer. The layer to layer orientation or registration, size, location, shape and isolation of such electrically active structures affects the reliability and performance of resulting integrated circuits employing such structures. For example, registration error, mis-alignment, mis-patterning, or other pattern anomalies that can result from process drift or other undesirable processing conditions can compromise the performance of the structures and adversely affect resulting chip performance and reliability.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

One or more aspects of the present invention pertain to a subset test module and associated methodology for utilizing the same that facilitate identification of process drift in semiconductor fabrication processing. A test wafer having a plurality of die formed thereon has a plurality of test modules formed within each die. The plurality of test modules are substantially the same from die to die. The respective modules similarly include a plurality of test structures that are substantially the same from module to module. Corresponding test structures within respective modules on different die can be inspected and compared to one another to find those structures that are sensitive to process drift. One or more structures that experience substantial differences or variations from module to module on different die are utilized to develop one or more test modules that can be selectively located within production wafers and monitored during semiconductor processing to determine whether process drift and/or one or more other aberrant processing conditions are occurring.

According to one or more aspects of the present invention, a method of fashioning one or more test modules suitable for implementation with a semiconductor fabrication system to monitor for semiconductor fabrication process drift includes forming one or more test modules in die on a test wafer, wherein respective test modules in different die include similar sets of test structures. The method also includes inspecting one or more of the test structures in one or more of the test modules on one or more of the die, and comparing inspected test structures of one or more die to corresponding test structures in one or more other die. The method further includes determining whether differences exist between the inspected corresponding test structures and then generating one or more subset test modules comprising inspected structures that differed substantially from die to die and thus indicate a sensitivity to process drift or other changes in processing conditions.

In accordance with one or more other aspects of the present invention, the method further includes utilizing one or more of the subset test modules to determine process drift by incorporating one or more of the subset test modules within a production wafer undergoing the fabrication process, monitoring one or more features within one or more of the subset modules, comparing corresponding features from one or more subset modules to another and determining that process drift may be occurring where corresponding features vary between one or more subset modules.

According to one or more other aspects of the present invention, a test wafer suitable for use in developing one or more subset test modules that are themselves suitable for use in a semiconductor fabrication process to facilitate a determination of process drift includes one or more die, wherein the respective die have a plurality of test modules formed thereon that are substantially the same from die to die. The corresponding test modules on the respective die have a plurality of test structures formed thereon that are substantially the same from module to module. Differences in corresponding test structures on corresponding test modules may be indicative of process drift, and one or more subset test modules may be generated from one or more test structures that exhibit differences indicative of process drift.

In accordance with one or more further aspects of the present invention, a mechanism suitable for incorporation into a production wafer to facilitate a determination of semiconductor fabrication process drift includes one or more subset modules comprising a plurality of test structures formed thereon. The test structures are sensitive to process drift or other aberrant processing conditions, wherein the plurality of test structures are substantially the same among at least some of the subset modules, and wherein detected differences between corresponding test structures provide an indication that process drift or other aberrant processing conditions are occurring.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 9 is yet another schematic diagram illustrating a cut away side view of a portion of the die depicted in FIGS. 5 and 6 demonstrating how one or more structures are formed thereon.

FIG. 10 is still another schematic diagram illustrating a cut away side view of a portion of the die depicted in FIGS. 5 and 6 demonstrating how one or more structures are formed thereon.

FIG. 12 is a schematic illustration depicting a top view of an example of a portion of a die that may be included on a test wafer, such as that depicted in FIG. 1, or on a production wafer in accordance with one or more aspects of the present invention.

FIG. 13 is a schematic diagram illustrating a cut away side view of a portion of the die shown in FIG. 12, taken along dotted line 13—13.

FIG. 14 is a schematic diagram similar to that of FIG. 13, illustrating a cut away side view of a portion of a die that may be included on a test wafer, such as that depicted in FIG. 1, or on a production wafer in accordance with one or more aspects of the present invention.

FIG. 23 illustrates a flow diagram of a methodology for fashioning and utilizing a test module in accordance with one or more aspects of the present invention to monitor for process drift and/or other aberrant behavior in semiconductor fabrication processing.

DETAILED DESCRIPTION OF THE INVENTION

Figure 1:
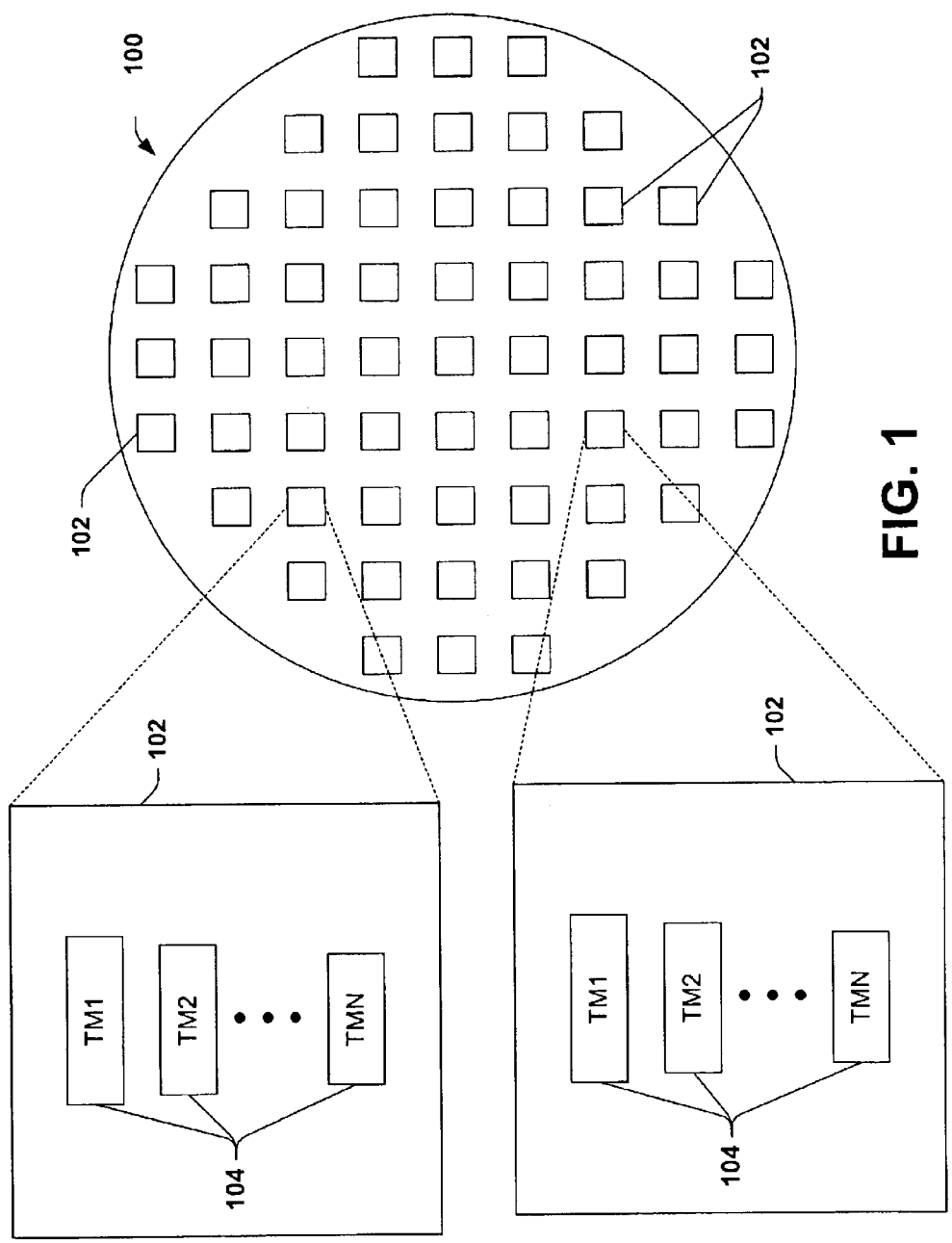
FIG. 1 is a schematic diagram illustrating the layout of a test wafer in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, structures and devices are shown in block diagram form in order to facilitate describing one or more aspects of the present invention.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

The term "component" as used herein is intended to include computer-related entities, either hardware, a combination of hardware and software, software, or software in execution. For example, a component may be a process running on a processor, a processor, an object, an executable, a thread of execution, a program, a computer, or any combination thereof. By way of illustration, both an application program running on a server and the server can be components.

One or more aspects of the present invention relate generally to a subset test module and associated methodology for utilizing the same that facilitate identification of process drift in semiconductor fabrication processing. A test wafer having a plurality of die formed thereon has a plurality of test modules formed within each die. The plurality of test modules are substantially the same from die to die. The respective modules similarly include a plurality of test structures that are substantially the same from module to module. Corresponding test structures within respective modules on different die can be inspected and compared to one another to find those structures that are sensitive to process drift. One or more structures that experience differences from module to module on different die are utilized to develop one or more test modules that can be selectively located within production wafers and monitored during semiconductor processing to determine whether process drift and/or one or more other aberrant processing conditions are occurring.

FIG. 1 is a schematic diagram illustrating the layout of a test wafer 100 in accordance with one or more aspects of the present invention. The wafer 100 has a plurality of die 102 located thereon. Enlarged representations of a couple of the die illustrate an arrangement according to one or more aspects of the present invention wherein each die possess a plurality of test modules (TMs) 104 formed therein. In particular, each of the die (or at least a significant number thereof) includes the same arrangement of test modules TM1–TMN, where N is a positive integer.

Additionally, in the exemplary structure illustrated, the test modules 104 within each die differ in size, such that TM2 has one or more features that are smaller than those associated with TM1, and TMN features are smaller than those in TM2. It will be appreciated, however, that the ordering of the different size test modules 104 is arbitrary, and that the particular ordering depicted in FIG. 1 is done for exemplary purposes only. For example, TM2 can be smaller than TMN, and TM1 can be smaller than TM2. Likewise, TM2 can be smaller than both TM1 and TMN, where TM1 is smaller than TMN, etc. This will be discussed in greater detail below.

Figure 2:
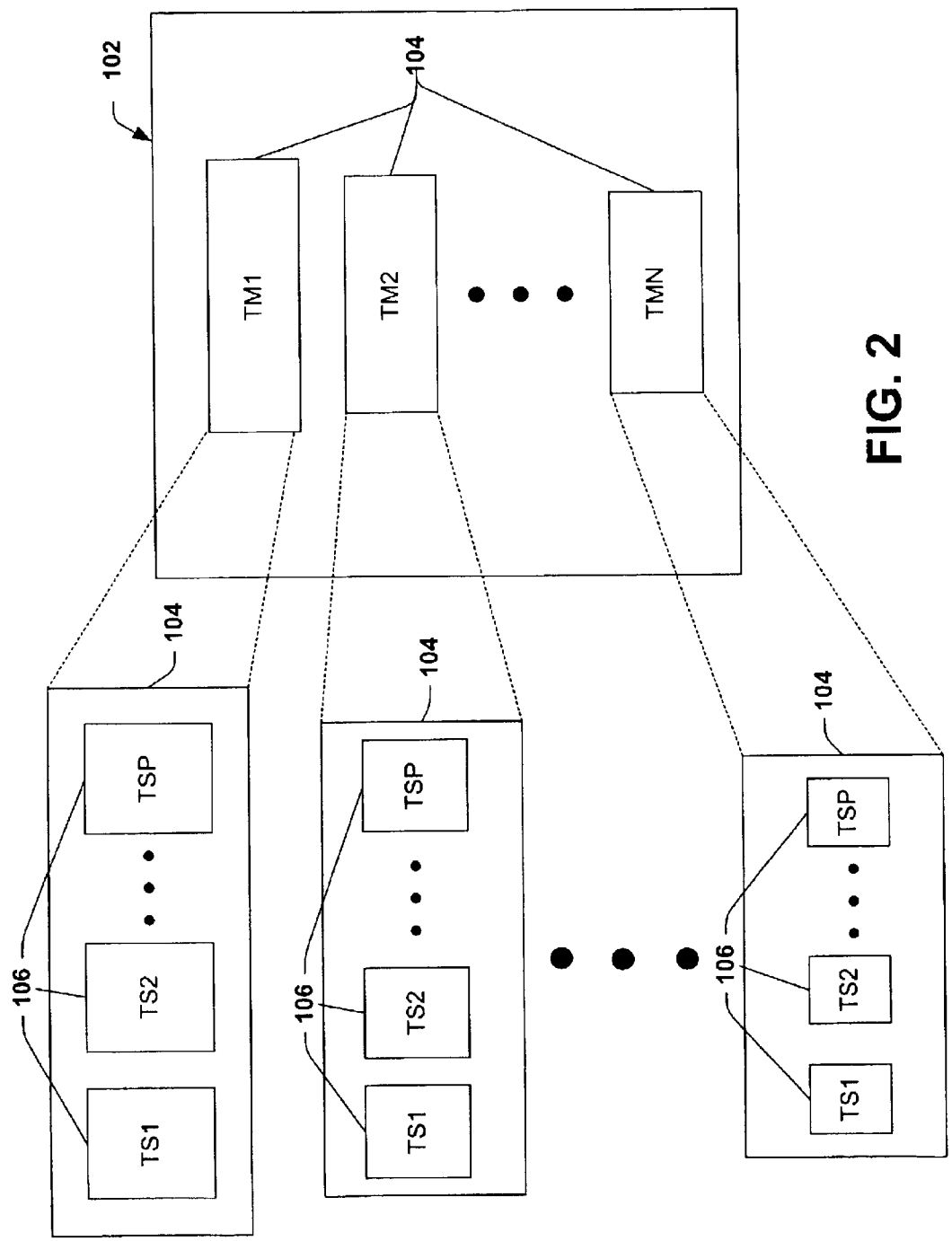
FIG. 2 is a schematic diagram illustrating the layout of a die in accordance with one or more aspects of the present invention.

FIG. 2 is a schematic diagram illustrating the layout of an exemplary die 102 in accordance with one or more aspects of the present invention. The die 102 is representative of the die depicted in FIG. 1, and may accordingly be located on a wafer along with a plurality of similarly configured die. The die 102 includes a plurality of test modules TM1–TMN, where N is a positive integer. Enlarged representations of the test modules 104 reveal that they include a plurality of respective test structures (TS) TS1–TSP or test features, where P is a positive integer.

It can be seen that the test structures 106 differ/are reduced in size from one test module 104 to the other. As set forth in the preceding discussion of the test modules, it will be appreciated, however, that the ordering of the different size test structures is arbitrary, and that the particular ordering illustrated is exemplary only. For example, the size of the test structures in test module TM2 can be smaller than the test structures in test module TMN, and the test structures in test module TM1 can be smaller than the test structures in test module TM2. Similarly, the test structures in test module TM2 can be smaller than the test structures in both test module TM1 and the test structures in test module TMN, where the test structures in test module TM1 are smaller than the test structures in test module TMN, etc.

It will be appreciated that the test structures 106 can be sized according to design rules, which dictate characteristics to which the devices can be made to ensure certain predetermined performance or reliability characteristics for a given process. For example, the design rules for a particular semiconductor process may dictate that a particular structure or feature within the device is to have a certain minimum dimension (e.g., width) to ensure that the device performs with a desired reliability.

Accordingly, the test structures 106 (and thus the test modules 104) can be sized in incremental percentages of a design rule. In the illustrated example, the test structures TS1–TSP of the first test module are formed according to one hundred percent of the design rule. The test structures TS1–TSP of the second test module are formed according to ninety seven percent of the design rule. And, the test structures TS1–TSP of the Nth test module can be formed according to a lesser percent of the design rule, etc. It will be appreciated, however, that these figures are exemplary only and that the test structures (and thus the test modules) can be sized according to any variations of a design rule. For example, the test structures can be sized so that one or more of them exceed one hundred percent of the design rules.

Figure 3:
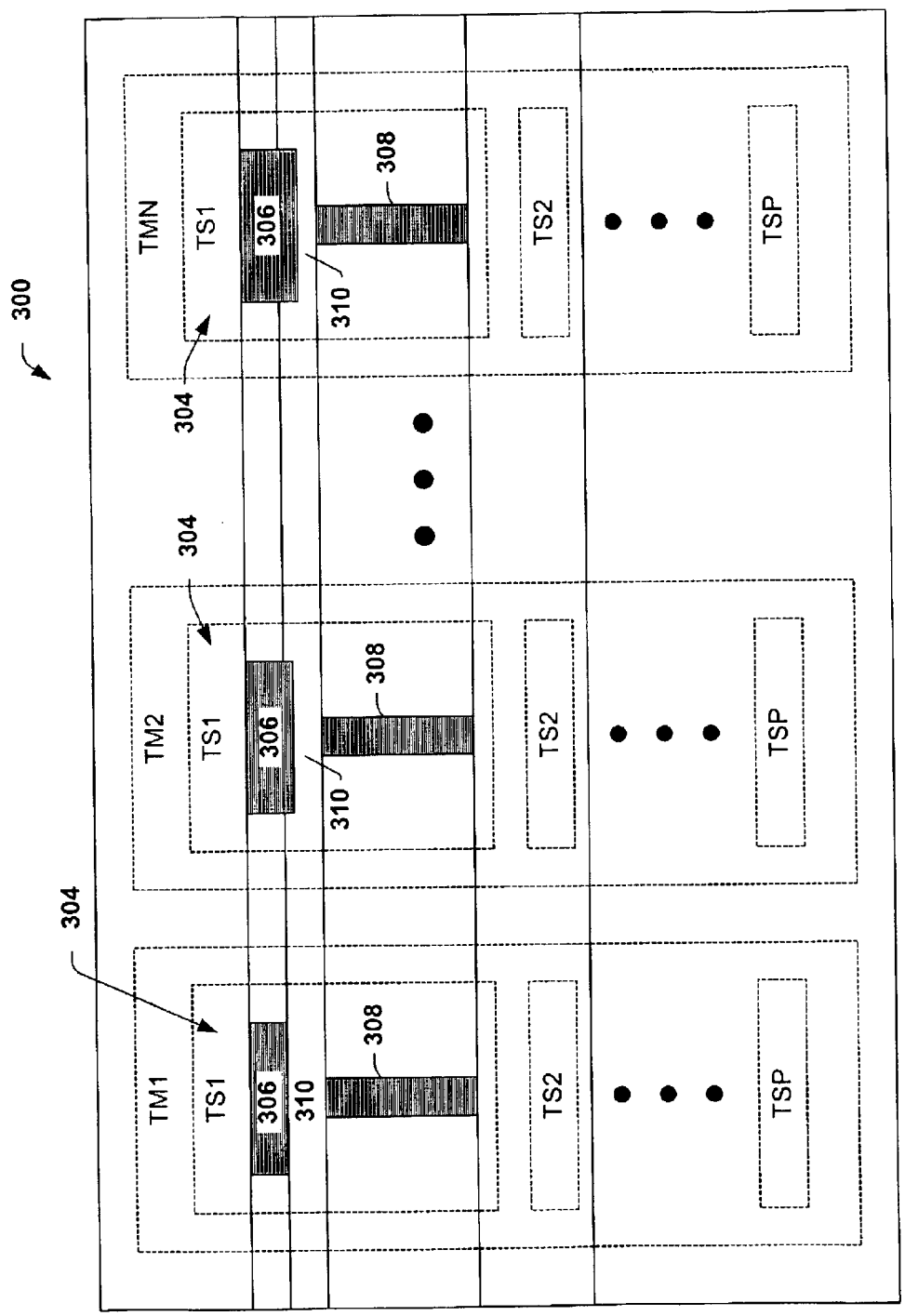
FIG. 3 is a plan view of a portion of a die on a wafer illustrating an exemplary test structure or test feature in accordance with one or more aspects of the present invention.

Turning to FIG. 3, a top down schematic view of a portion of a die 300 on a wafer includes an exemplary test structure or test feature 304. The instances of the exemplary test structure shown depict a gate pattern wherein two conductive materials 306, 308 are separated by a non-conductive dielectric material 310. More particularly, the structure shown may correspond to a gate of 0.09 microns, for example, where poly gate leads form a discontinuous T-shape. Electrical bridging can occur in such patterns where the gates are formed too close to one another and/or unintentionally touch or are too close resulting in dielectric reliability issues. Such a situation may occur, for example, as a result of optical proximity errors or process drift.

In the example shown, the test structures 304 are labeled to correspond to the first test structure TS1 replicated in each of the test modules TM1–TMN illustrated in FIG. 2. Thus, FIG. 3 illustrates a test structure or feature 304 that is repeated on N different test modules, but has sizing differences in each of the modules. More particularly, a spacing between the poly features 306, 308 differs among the test structures. From left to right, the poly spacing is reduced from one test structure to the next. The poly spacing in the first module TM1 may, for example, correspond to one hundred percent of a design rule, while the spacing in the second and Nth modules (wherein N=3) may correspond to ninety seven and ninety four percent of the design rule, respectively.

Figure 4:
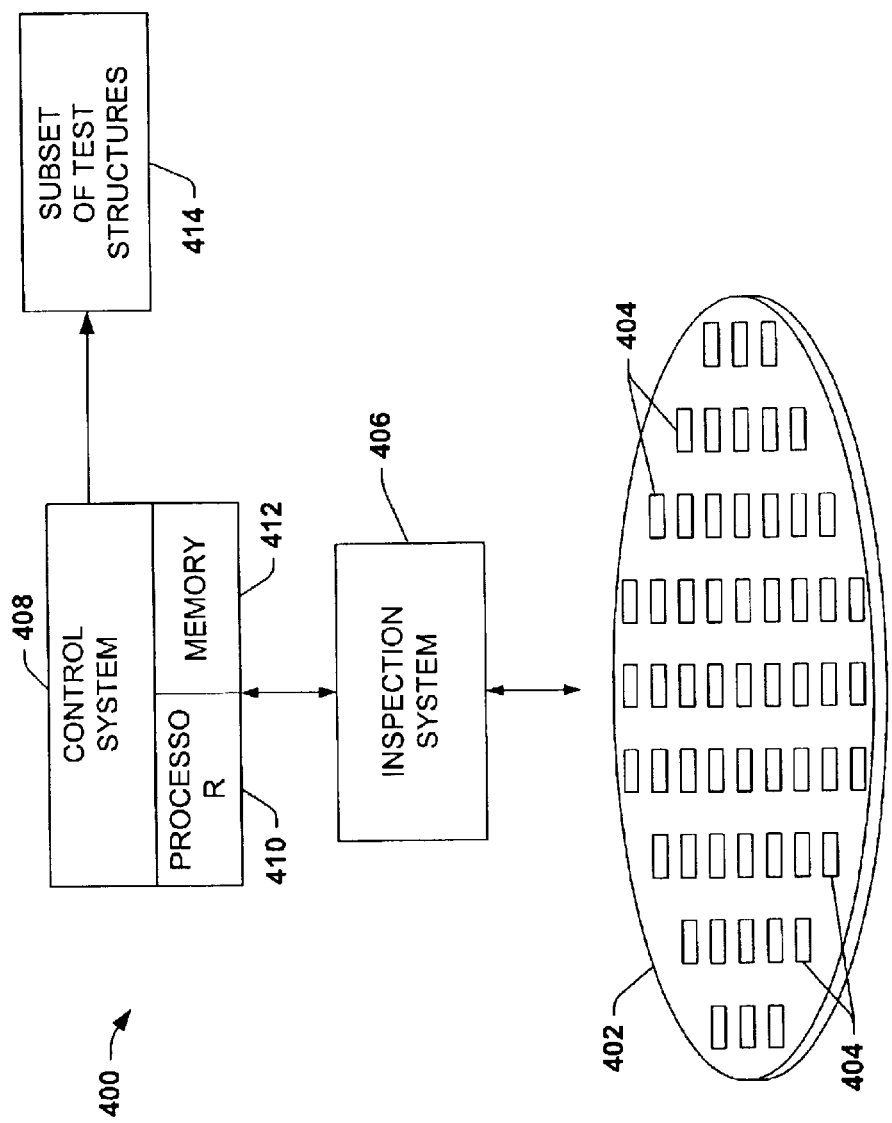
FIG. 4 is a system level diagram illustrating a test system, wherein a test wafer is implemented in accordance with one or more aspects of the present invention.

FIG. 4 illustrates a test system 400, wherein a test wafer 402 is implemented in accordance with one or more aspects of the present invention. The test wafer 402 and its arrangement is similar to that depicted in FIGS. 1–3 and thus has a plurality of die 404 formed thereon. All or at least most of the die 404 also have a plurality of test modules (e.g., 1–N, where N is a positive integer) formed thereon (not shown), and the test modules themselves have a plurality of test structures or test features (e.g., 1–P, where P is a positive integer) formed thereon (not shown).

An inspection system 406 is included to facilitate a determination of whether a particular test structure is sensitive to changes in process conditions. More particularly, the inspection system facilitates a comparison of test structures or features in one die to the same structures in an adjacent die. If there is a substantial difference, then this may be indicative of a suspicious point. By way of example, should corresponding test structures differ by a predetermined amount or according to other predefined criteria, then a certain sensitivity designation can be assigned to the subject feature(s). An optical tool or an electrical test tool, for example, can be utilized to interrogate a first test structure on a first test module located on a first die. The same test structure on a similar test module located on a second die can similarly be inspected. This can be done for any number of structures on any number of test modules located on any number of die 404. By way of example, the test modules can have hundreds of different types of structures and/or feature combinations located thereon. Measured values of the same structures taken from similar test modules located on different die can then be compared to determine sensitivity of test structures to operating conditions. More particularly, one or more differences in these values may be indicative of a structure that is sensitive to changes in processing conditions, process drift or subtle production abnormalities.

It will be appreciated that, as described above, the test structures can be sized differently to identify enhanced sensitivity. For example, the test structures and thus the test modules can be replicated in smaller and smaller increments, such as by about three percent of the design rule or so, so that a first test module on a die is a particular size according to a design rule, a second test module on the same die is ninety seven percent of this size, a third test module on the die is ninety four percent of this size, a fourth test module on the die is ninety one percent of this size, etc. This facilitates finding those features that are prone to failures (e.g., shorts or opens) due to variations in processing conditions, such as alignment, layer thickness, layer flatness, layer (non) uniformity, illumination intensity, focus control, degree of focus, developer conditions, etch characteristics (e.g., composition), etc. Generally speaking, smaller features are more likely to exhibit anomalous behavior under certain circumstances. It will be further appreciated that gradual reductions in feature sizes (e.g., by about three percent or so) allow sensitive features to be identified while mitigating the risks of exposing a wafer to contaminants. Drastic reductions in feature sizes (e.g., of about twenty percent or more) are preferably avoided because such reductions can, for example, cause features to be printed very poorly, such that the features may lift off of a substrate and become floating contaminants that can cause damage to other parts of a wafer in production.

It will also be appreciated that the inspection system 406 can be a standalone component and/or can also be distributed between two or more cooperating devices and/or processes. Similarly, the inspection system 406 can reside in one physical or logical device (e.g., computer, process) and/or be distributed between two or more physical or logical devices. The inspection system 406 includes one or more non-destructive measurement components adapted to take readings of the test structures. The inspection system is operatively coupled to a control system 408 that can be configured in any suitable manner to control and operate the various components within the system 400 in order to carry out the various functions described herein. For example, the control system 408 may provide one or more signals to the inspection system to control at least some of the operations of the inspection system. Similarly, the control system 408 is adapted to receive signals from the inspection system 406 indicative of readings taken by the inspection system 406. Such readings may, for example, be related to critical dimensions, conductivity, resistivity, etc. of the test structures.

In the example shown, the control system 408 includes a processor 410, such as a microprocessor or CPU, coupled to a memory 412. The processor 410 can be any of a plurality of processors, and the manner in which the processor 410 can be programmed to carry out the functions relating to the present invention will be readily apparent based on the description provided herein. The memory 412 included within the control system 408 serves to store, among other things, program code executed by the processor 410 for carrying out operating functions of the system 400 as described herein. The memory 412 may include read only memory (ROM) and random access memory (RAM). The ROM contains among other code the Basic Input-Output System (BIOS) which controls the basic hardware operations of the system 400. The RAM is the main memory into which the operating system and application programs are loaded. The memory 412 may also serve as a storage medium for temporarily storing information such as, for example, tabulated data and algorithms that may be employed in carrying out one or more aspects of the present invention. The memory 412 can also serve as a data store (not shown) and can hold, for example, patterns against which observed data can be compared as well as other data that may be employed in carrying out the present invention. For mass data storage, the memory 412 may include a hard disk drive.

A collection or subset of features or elements 414 that are highly sensitive to process variations and that are dimensioned so as to have an increased sensitivity can thus be identified and output by the system 400. Since the subset 414 comprises less than all of the features in the original test module, the size of the subset of features may be small enough to be formed within a scribe line or other unused available space (e.g., "white space") within a production wafer (e.g., on a die, between die, between elements within a die) to monitor process drift. The subset of test structures 414 would thus have its own set of design rules that are smaller than production design rules to expose process variations or drift.

It will be appreciated that the particular makeup of the subset of features 414 may be dependent upon the process under which the test structures were analyzed. For example, a BiCMOS process may yield a subset of features different than that produced by an embedded memory process because different processes operate under different conditions. Accordingly, the test structure may be developed under controlled variations in processing conditions to provide an indication as to which processing conditions have the greatest impact on particular features. This facilitates identifying which processing conditions a detected process drift may be attributable to. For example, anomalous behavior detected within certain features may be indicative of particular process condition(s) that may need to be readjusted. These can then be focused in on and examined to determine whether, in fact, they are behaving abnormally, and, if so, what adjustments can be made to mitigate the problem. For example, aberrant readings obtained from one particular feature during a particular type of processing (e.g., BiCMOS fabrication) may be indicative of deviations in illumination intensity. Accordingly, that feature and/or surrounding features may be monitored more closely to determine the extent to which exposure should be increased or decreased to achieve a desired result during the photolithography fabrication process.

Figure 5:
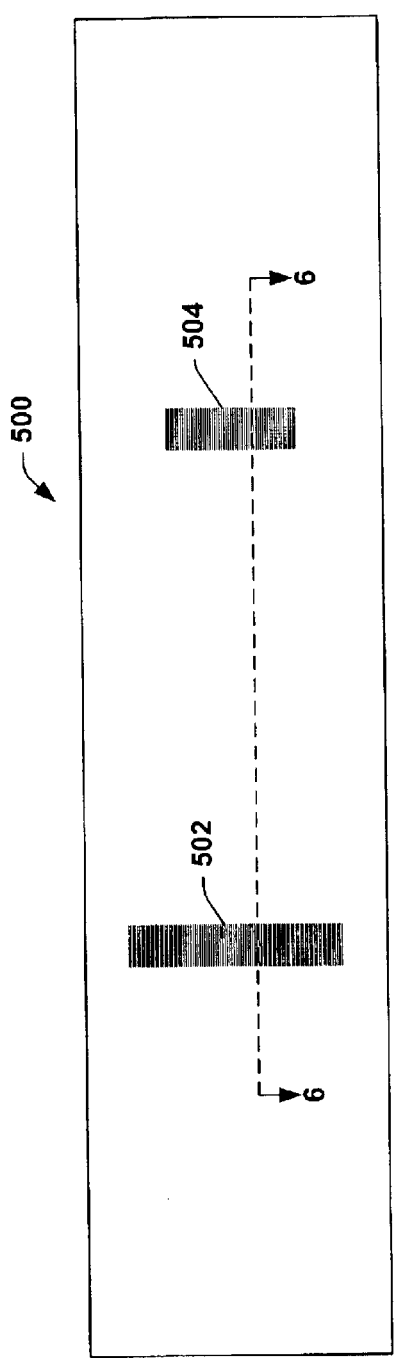
FIG. 5 is a schematic illustration depicting a top view of an exemplary portion of a die that may be included on a test wafer, such as that depicted in FIG. 1, or on a production wafer according to one or more aspects of the present invention.

By way of further example, FIGS. 5–13 illustrate additional situations that can be identified according to one or more aspects of the present invention. FIG. 5 is a schematic illustration depicting a top view of a portion of a die 500 that may be included on a test wafer, such as that depicted in FIG. 1, or on a production wafer. Two regions of the die 502, 504 include an electrically active/conductive material, such as copper. These regions 502, 504 may, for example, be part of an integrated circuit formed upon the die. These regions do not appear to be electrically coupled to one another. Thus, a visual inspection of this arrangement from a top view, such as that presented in FIG. 5, would not reveal an unintended electrical coupling between these two regions.

Figure 6:
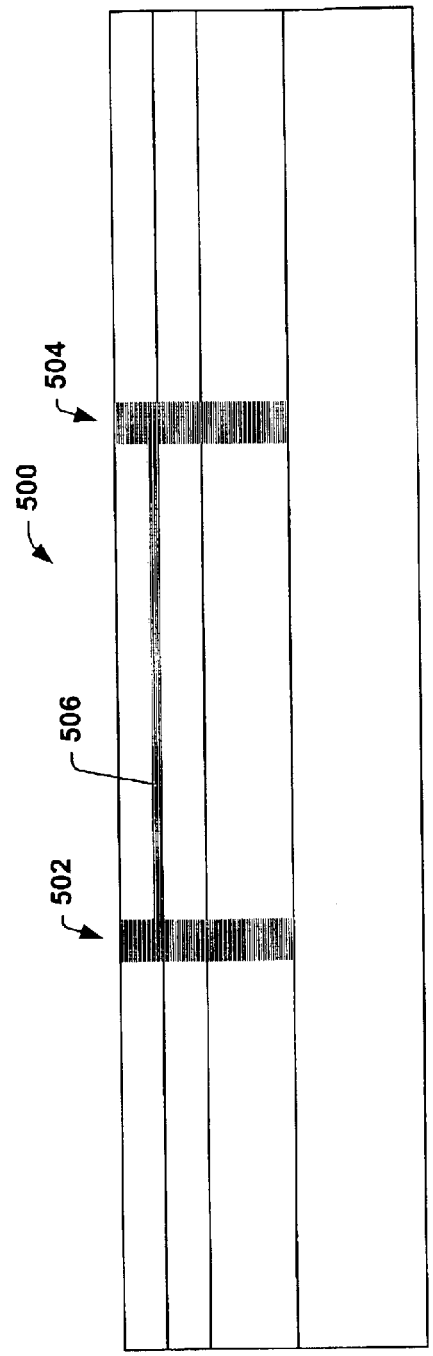
FIG. 6 is a schematic diagram illustrating a cut away side view of a portion of the die depicted in FIG. 5, taken along dotted line 6—6.
Figure 7:
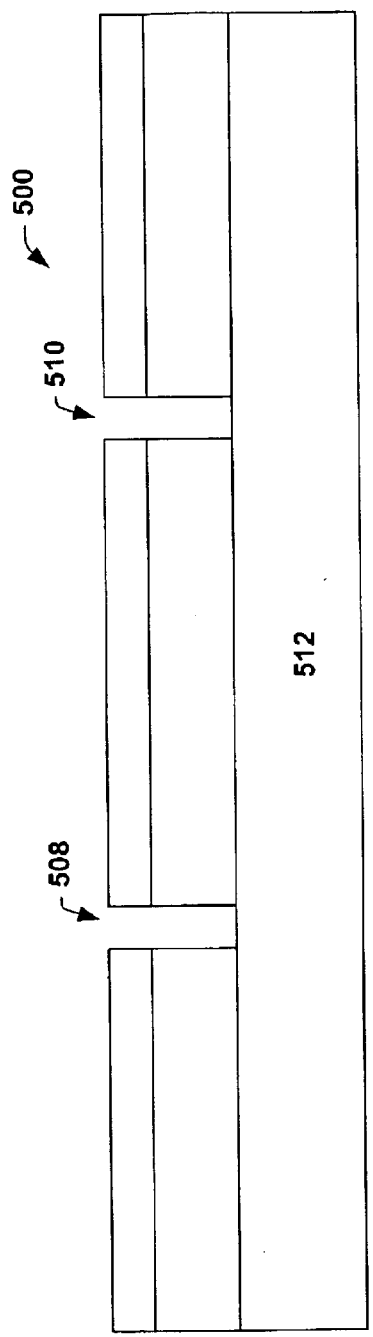
FIG. 7 is a schematic diagram illustrating a cut away side view of a portion of the die depicted in FIGS. 5 and 6 demonstrating how one or more structures are formed thereon.
Figure 8:
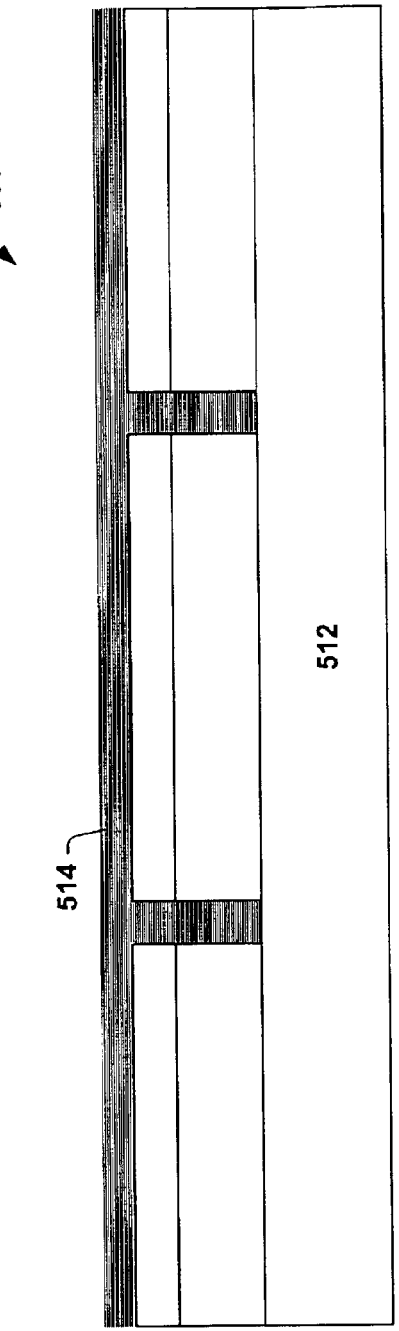
FIG. 8 is another schematic diagram illustrating a cut away side view of a portion of the die depicted in FIGS. 5 and 6 demonstrating how one or more structures are formed thereon.

Turning to FIG. 6, however, which is a schematic diagram illustrating a cross-section of a portion of the die 500 shown in FIG. 5 taken along the dotted line 6—6. It will be appreciated that an electrically active/conductive material 506 can in fact exist between these two regions 502, 504 on a lower layer of the die. FIGS. 7–10 are schematic diagrams illustrating a cross-section of a portion of the die 500, and demonstrate just how such an undesirable electrical connection can be formed within a wafer (e.g., due to under etching and/or under polishing). FIG. 7 illustrates that respective trenches 508, 510 for the regions can be formed (e.g., etched) into a couple of layers of the die, which are themselves formed upon another layer 512 (e.g., a bottom substrate layer). In FIG. 8, a layer 514 of the conductive material can then be formed over the layers to fill the trenches. FIG. 9 shows that the layer of conductive material can then be etched and/or polished away to leave the apertures filled with the conductive material. However, under etching and/or under polishing can leave a trace amount 506 (shown enlarged for purposes of simplicity) of the conductive material between these conductive regions. FIG. 10 shows that additional layer(s) 516 can then be formed over the existing layers. These additional layers can then be etched and filled with conductive material to establish the configuration depicted in FIG. 6, wherein the electrically active regions are undesirably, but unnoticeably, interconnected by residual material 506.

Figure 11:
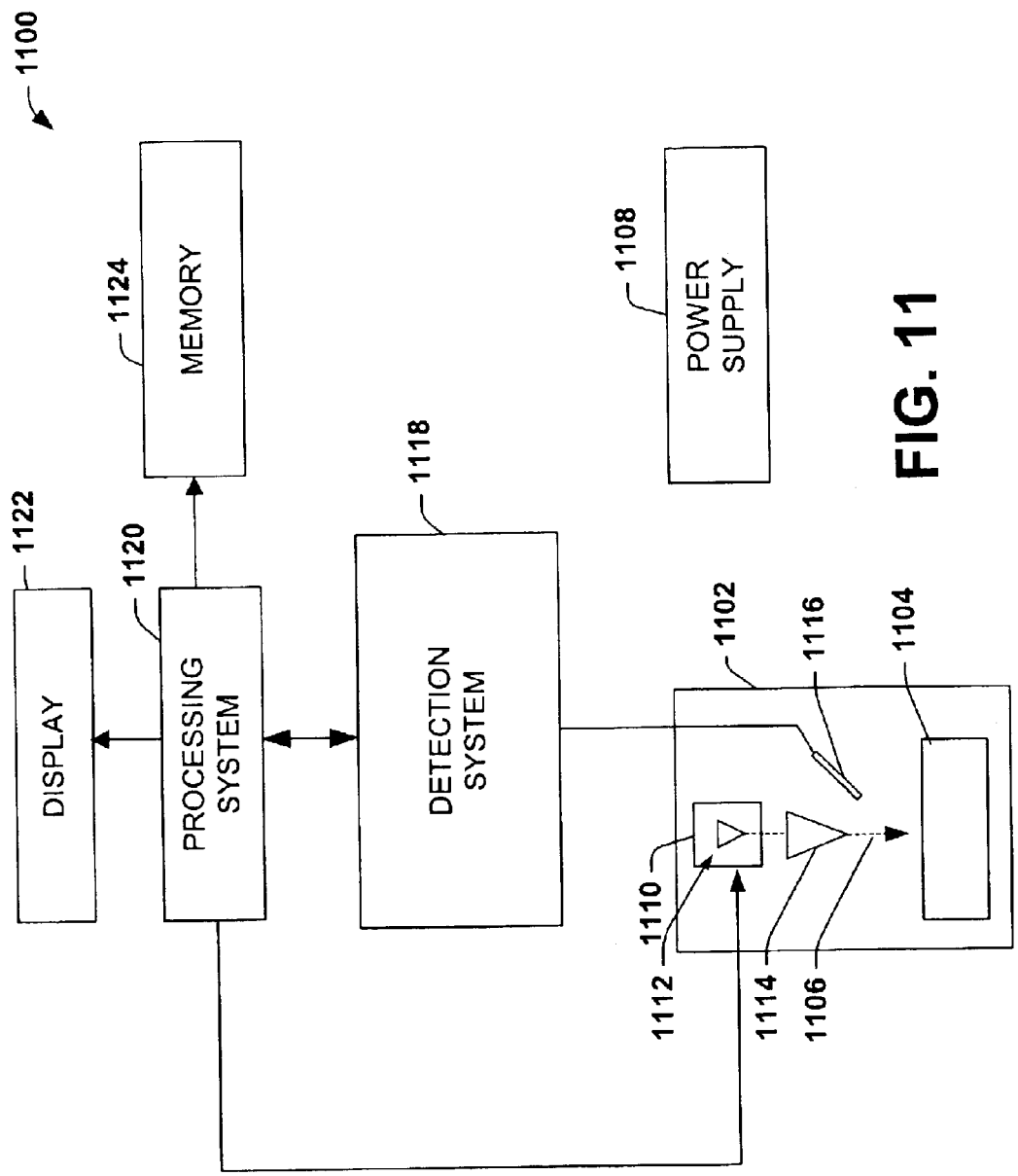
FIG. 11 is a schematic block diagram illustrating an exemplary system suitable for inspecting a test wafer comprising an arrangement according to one or more aspects of the present invention, such as that described with respect to FIGS. 5–10.

FIG. 11 is a schematic block diagram illustrating an exemplary system 1100 suitable for inspecting a test wafer comprising an arrangement such as that described above with respect to FIGS. 5–10. The system 1100 utilizes scanning electron microscope (SEM) technology and includes a chamber 1102 for housing a wafer 1104 or a sample portion thereof during inspection. An electron beam 1106 is created from a high voltage supplied by a power supply 1108 associated with a beam generating system 1110, which includes an emission element 1112. Various directing, focusing, and scanning elements (not shown) in the beam generating system 1110 guide the electron beam 1106 from the emission element 1112 to an electromagnetic lens 1114. The beam 1106 is then directed from the lens 1114 toward the sample portion 1104. As the electron beam 1106 strikes the wafer 1104, secondary electrons and x-rays are emitted which are detected by a detector 1116 and are provided to a detection system 1118.

The detection system 1118 provides digitized detector signals to a processing system 1120 for performing measurement and signal analysis, by which an image of the scanned sample 1104 may be generated. The image may then be directed to a display 1122 by the processing system 1120. Contrast of the displayed image is related to variations in the flux of electrons arriving at the detector 1116 and is related to the yield of emitted electrons from the wafer 1104 to the incident electrons from the electron beam 1106.

The detection system 1118 receives the electron emissions from the sample 1104 via the detector 1116 and preferably digitizes the information for the processing system 1120. The processing system 1120 provides critical dimension information to the display 1122 and/or stores information in a memory 1124. A processor (not shown) is included in the processing system 1120 for controlling the beam generating system 1110, providing critical dimension measurements, and for performing signal analysis. The processor in the processing system 1120 is programmed to control and operate the various components within the system 1100 in order to carry out various inspection and display functions.

The memory 1124 is operatively coupled to the processing system 1120 and serves to store program code executed by the processor for carrying out operating functions of the system 1100, and serves as a storage medium for temporarily storing information such as critical dimension data or other data. The power supply 1108 may be any power supply (e.g., linear, switching) suitable for carrying out one or more aspects of the present invention.

By way of still further example, FIGS. 12–14 illustrate additional situations that can be identified in accordance with one or more aspects of the present invention. FIG. 12 is a schematic illustration depicting a top view of a portion of a die 1200 that may be included on a test wafer, such as that depicted in FIG. 1, or on a production wafer. Two regions 1202, 1204 of the die include an electrically active/conductive material, such as copper. These regions may, for example, be part of an integrated circuit formed upon the die.

FIG. 13 is a schematic diagram illustrating a cross-section of the portion of the die 1200 shown in FIG. 12 taken along the dotted line 13—13. It can be seen that the conductive regions are formed by respective vias that are filled with the conductive material. A lower 1206 layer (e.g., substrate) of the die in this example is connected to ground, and facilitates connecting the conductive regions to ground. The upper contact area 1208 of the left conductive region 1202 is not, however, supposed to be connected to ground by way of the conductive filament 1212 through dielectric layer 1210. Dielectric layer 1210 is supposed to be continuous over the underlying layer 1202 preventing electrical connection of 1208 to ground. The right conductive region 1204 is similarly mis-connected in the example shown. More particularly, the entirety of the right conductive region 1204 is supposed to be coupled to ground. However, it is not connected to ground by virtue of an unwanted void 1214 present within the via.

FIG. 14 is a schematic diagram similar to that of FIG. 13, illustrating a cut away side view of a portion of a die 1400 that may be included on a test wafer, such as that depicted in FIG. 1, or on a production wafer. Two vias are filled with a conductive material, such as copper, to form two electrically active/conductive regions 1402, 1404 within the die that may, for example, be part of an integrated circuit formed upon the die. Similar to the situation depicted in FIGS. 5–10, however, the two electrically active regions 1402, 1404 are interconnected by an unwanted strip 1406 of conductive material that remains due to insufficient polishing and/or etching, for example. And, as discussed above with regard to FIGS. 12 and 13, a lower 1408 (e.g., substrate) layer of the die 1400 is coupled to ground, and facilitates connecting the conductive regions to ground. While the right conductive region 1404 is intended to be connected to ground, the left conductive region 1402 is not designed to be connected to ground, and yet it is, due to the strip of material 1406 that electrically interconnects the left and right conductive regions 1402, 1404.

Figure 15:
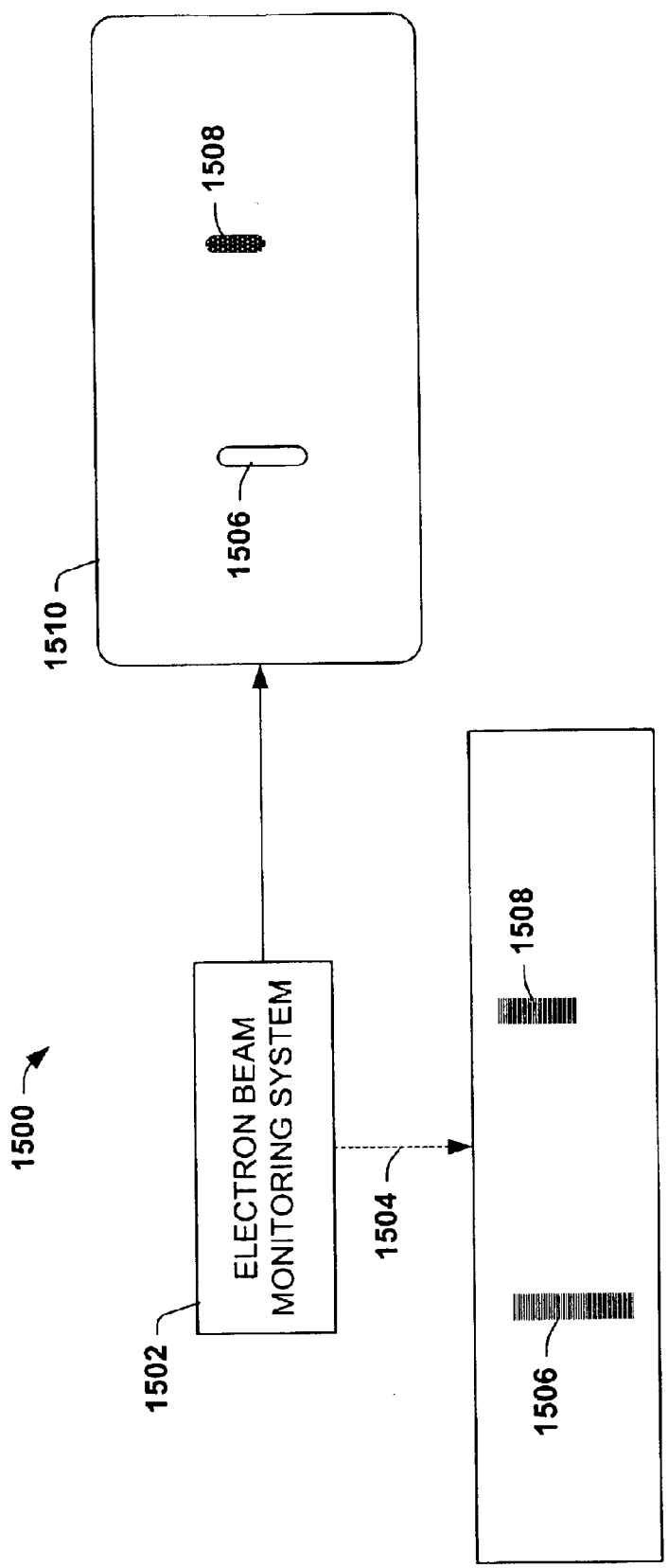
FIG. 15 is a block diagram that illustrates detection of situations such as that described with respect to FIGS. 12–14 according to one or more aspects of the present invention.

FIG. 15 is a block diagram that illustrates a system 1500 that can be utilized to detect situations such as that described with respect to FIGS. 12–14 according to one or more aspects of the present invention. The system relies on voltage contrast aspects, or the nature of what happens when an electron beam is utilized to inspect structures that are grounded, partially grounded or not grounded. Accordingly, the system utilizes an electron beam monitoring or inspection system 1502 that directs an electron beam 1504 at structures 1506, 1508 to be measured, and outputs the results of measurements to a processor for further analysis and/or to a display 1510 whereon they can be presented to a user.

In the example shown, the electron beam 1504 is directed at a portion of a wafer that has the electrically active regions 1506,1508 formed thereon. It will be appreciated that the portion may correspond to a portion of a die on a wafer, such as that depicted in FIGS. 1, 5, and 12–13. Structures that are grounded will bleed out charge from the electron beam and appear bright on the display. Structures that are not grounded will accumulate charge and act as an open circuit or a large resistor and appear as a different color and/or shade on the display. Thus, features that are grounded which should not be grounded or features that are not grounded which should be grounded can be identified. By way of example, the portion of the wafer illustrated in FIG. 15 can correspond to that depicted in FIG. 13. Accordingly, the electron beam inspection discloses the aforementioned defects by presenting the left conductive region 1506, which is unintentionally grounded, as a light strip on the display 1510, while presenting the right conductive region 1508, which is unintentionally open or not grounded, as a darker strip on the display 1510. Through a comparison of corresponding test structures from die to die (e.g., for a determination of whether they differ/bleed out charge by a predetermined amount), this information can be utilized to designate the subject test structures as having a particular sensitivity to the instant operating conditions.

Figure 16:
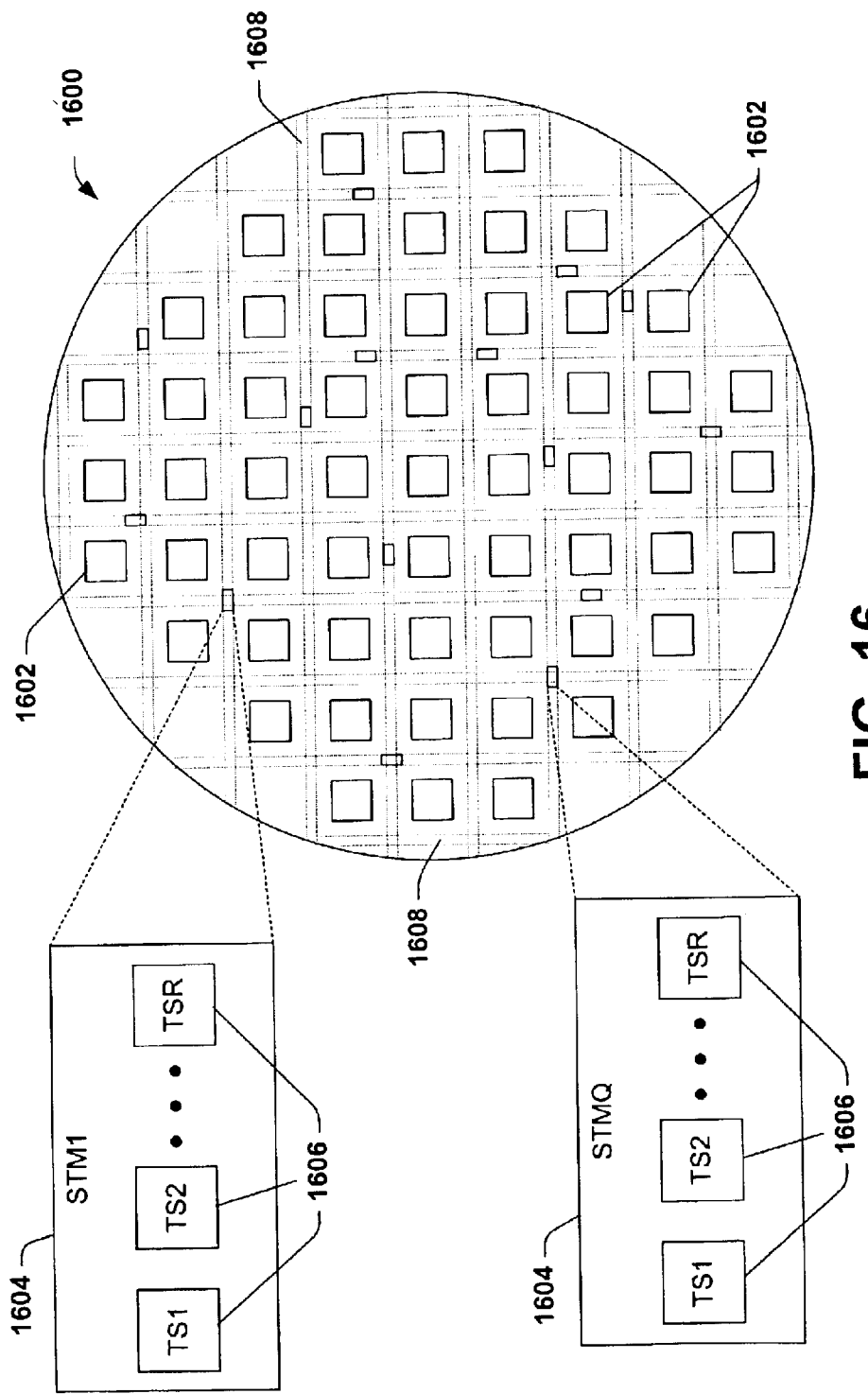
FIG. 16 is a schematic diagram illustrating the layout of a production wafer in accordance with one or more aspects of the present invention.

FIG. 16 is a schematic diagram illustrating the layout of a production wafer 1600 in accordance with one or more aspects of the present invention. The wafer 1600 has a plurality of die 1602 located thereon (with scribe lines shown enlarged for purposed of simplicity), as well as a plurality of subset test modules STM1–STMQ, where Q is a positive integer, located therein. Enlarged representations of a couple of the subset test modules 1604 reveal that that the test modules 1604 contain a plurality of test structures TS1–TSR, where R is a positive integer. The respective structures or features 1606 within the subset test modules 1604 are highly sensitive to process variations and are selected according to the process discussed supra. Such subsets can, for example, correspond to those produced in accordance with the discussion relating to FIG. 4. Accordingly, the test modules 1604 are small enough to be formed within scribe lines 1608 with the wafer 1600, as shown in the illustrated example. It will be appreciated, however, that the test modules 1604 can be located at any suitable locations on the wafer 1600, including within white or unused spaces of the die 1602.

Figure 17:
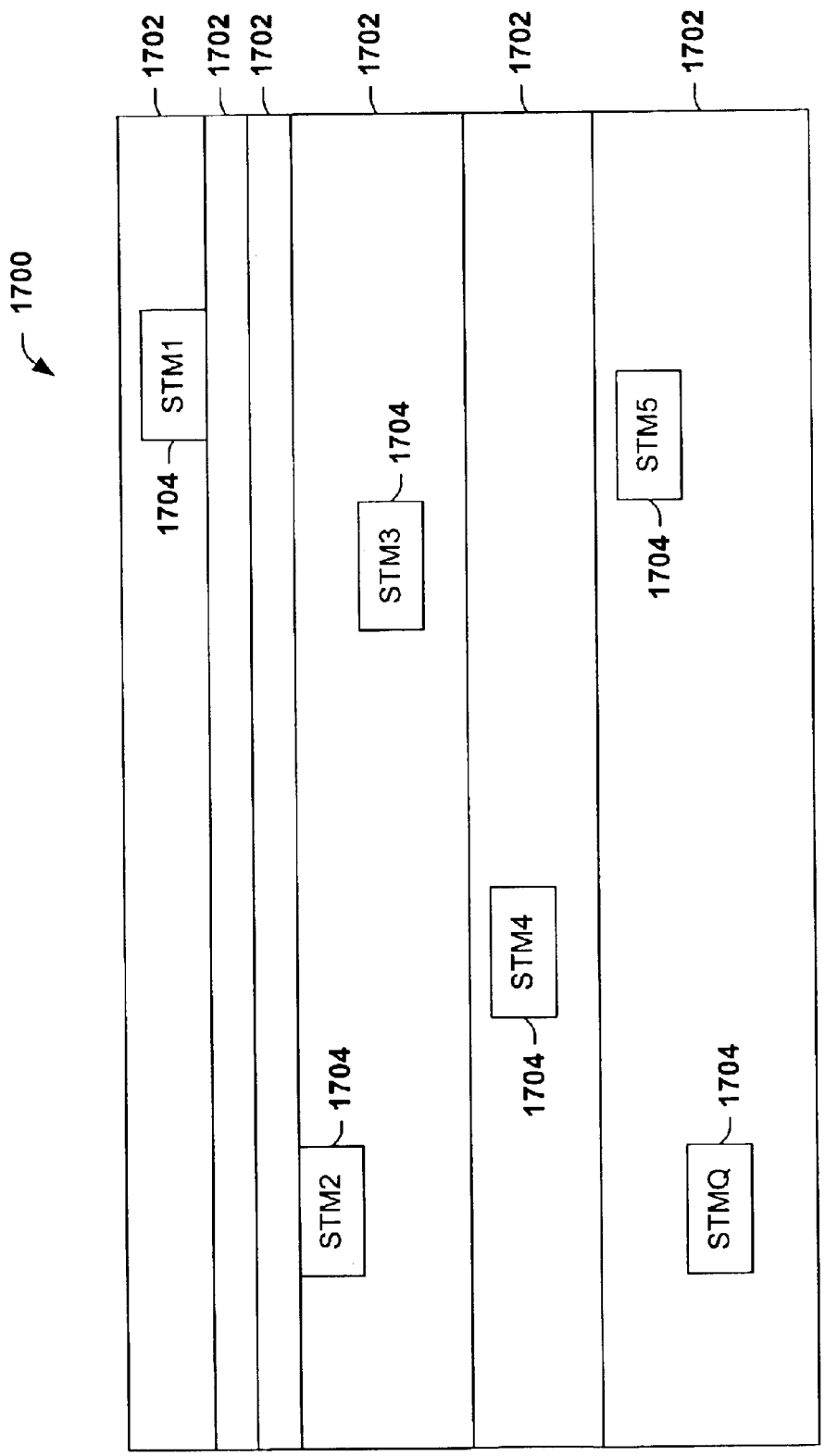
FIG. 17 is a schematic diagram illustrating a cut away side view of a portion of a die, such as that depicted in FIG. 16 according to one or more aspects of the present invention.

By way of example, FIG. 17 is a schematic diagram illustrating a cut away side view of the portion of a die 1700, such as that which may be depicted in FIG. 16. The die comprises a plurality of layers 1702, and a plurality of subset test modules STM1–STMS, where S is a positive integer, that are randomly scattered throughout a depth of the die 1700. It is to be appreciated that the subsets of test features 1704 may be designed for implementation with particular fabrication processes. For example, the particular makeup of the subsets of features may be dependent upon the process under which the test structures were analyzed. For example, a BiCMOS process may yield a subset of features different than that produced by an embedded memory process because different processes operate under different conditions. Accordingly, the test structures may correspond to or be more sensitive to particular processing conditions. It is to be further appreciated that all of the subset test modules need not contain the same test structures. This facilitates monitoring a greater variety of processing conditions. Additionally, subset test modules 1704 that comprise different test structures may differ in size. Since the test structures may reside at different points in the process, evaluation of the different structures may also be performed at differing process stages.

Figure 18:
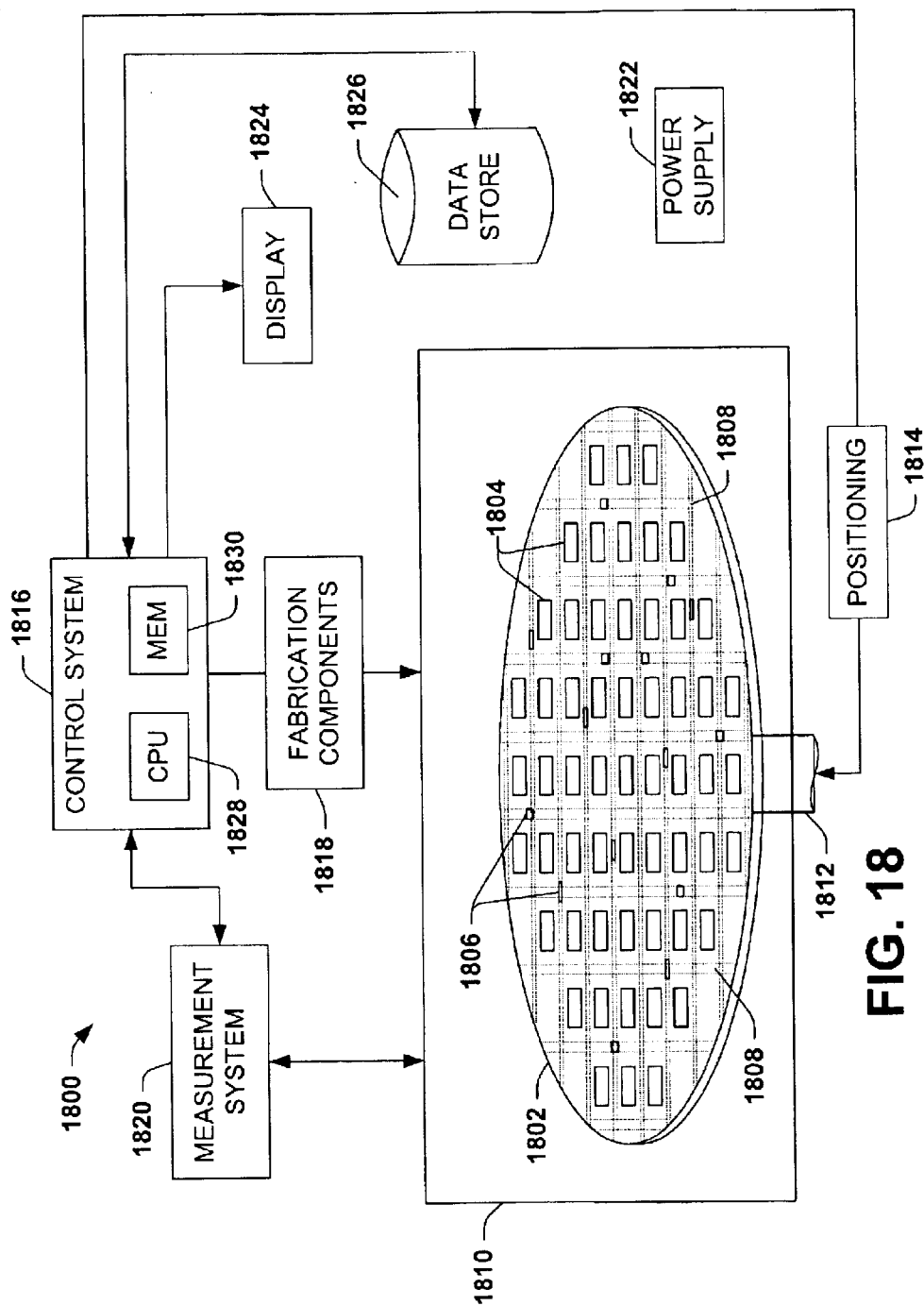
FIG. 18 is a schematic block diagram illustrating an exemplary semiconductor fabrication system wherein test structures may be implemented in accordance with one or more aspects of the present invention to identify process drift and/or pattern anomalies.

FIG. 18 is a schematic block diagram illustrating an exemplary semiconductor fabrication system 1800 wherein test structures may be implemented in accordance with one or more aspects of the present invention to identify process drift and/or pattern anomalies. A wafer 1802 similar to that described above with respect to FIGS. 16 and 17 having a plurality of die 1804 formed thereon and a plurality of subset test modules 1806 formed therein (e.g., within scribe lines 1808) is included within a processing chamber 1810. The chamber 1810 includes a support 1812, such as may include a stage (or chuck) operative to support the wafer 1802. A positioning system 1814 is operatively connected to the support 1812 for selectively maneuvering the wafer 1802 within the chamber 1810.

A control system 1816, fabrication components 1818 and a measurement system 1820 are also included in the exemplary system, as are a power supply 1822, display 1824 and data store 1826. The power supply 1822 is included to provide operating power to one or more components of the system 1800. It will be appreciated that any suitable power supply 1822 (e.g., battery, line power) can be employed to carry out the present invention. The display 1824 is operable to present relevant information to a user (e.g., graphical depictions of measured values). The data store 1826, discussed in greater detail below, is operable to be populated with data that may be utilized by the system. In the illustrated example, the control system 1816 is operatively coupled to the measurement system 1820, the fabrication components 1818, the positioning system 1814, the display 1824 and the data store 1826 for selectively controlling the same. For example, the control system 1816 can selectively control the fabrication components 1818 and/or one or more operating parameters associated therewith (e.g., via feed forward and/or feedback) based upon readings taken by the measurement system 1820.

The measurement system 1820 can include, for example, a scanning electron microscope (SEM) which interacts with structures within the subset test modules 1806 as described above to measure and ascertain critical dimensions, registration error, mis-patterning and/or other aspects of the structures to monitor and control the fabrication process while mitigating the amount of test equipment, real estate and time required for the fabrication process. Alternatively, the measurement system 1820 may comprise a probe test system or an optical tool. More particularly, a comparison of measurements taken from one die 1804 to another can facilitate an assessment of process drift or other process anomalies. Such information can be utilized, for example, to determine which processing conditions (e.g., alignment, illumination, etc.) are not operating within defined parameters and thus should be looked at more closely to determine how to rectify an undesirable situation. This information may also be utilized, for example, to generate feedback and/or feed-forward data for mitigating registration error and/or bringing critical dimensions within acceptable tolerances.

It is to be appreciated that any of a variety of fabrication components 1818 and/or operating parameters associated therewith can be selectively controlled based upon the readings taken by the measurement system 1820. By way of example and not limitation, this can include, but is not limited to, temperatures associated with the process, pressures associated with the process, concentration of gases and chemicals within the process, composition of gases, chemicals and/or other ingredients within the process, flow rates of gases, chemicals and/or other ingredients within the process, timing parameters associated with the process, alignment, illumination, exposure, magnification/de-magnification and/or focusing of items associated with the process, attributes of polishing and/or etching components associated with the process and excitation voltages associated with the process.

By way of further example, parameters associated with high-resolution photolithographic components utilized to develop IC's with small closely spaced apart features can be controlled to mitigate process drift, mis-patterning, registration errors and/or to achieve desired critical dimensions. In general, lithography refers to processes for pattern transfer between various media and in semiconductor fabrication, a silicon slice, the wafer, is coated uniformly with a radiation-sensitive film, the photoresist. The photoresist coated substrate is baked to evaporate any solvent in the photoresist composition and to fix the photoresist coating onto the substrate. An exposing source (such as light, x-rays, or an electron beam) illuminates selected areas of the surface of the film through an intervening master template for a particular pattern. The lithographic coating is generally a radiation-sensitized coating suitable for receiving a projected image of the subject pattern. Once the image from the intervening master template is projected onto the photoresist, it is indelibly formed therein.

Light projected onto the photoresist layer during photolithography changes properties (e.g., solubility) of the layer such that different portions thereof (e.g., the illuminated or un-illuminated portions, depending upon the photoresist type) can be manipulated in subsequent processing steps. For example, regions of a negative photoresist become insoluble when illuminated by an exposure source such that the application of a solvent to the photoresist during a subsequent development stage removes only non-illuminated regions of the photoresist. The pattern formed in the negative photoresist layer is, thus, the negative of the pattern defined by opaque regions of the template. By contrast, in a positive photoresist, illuminated regions of the photoresist become soluble and are removed via application of a solvent during development. Thus, the pattern formed in the positive photoresist is a positive image of opaque regions on the template. Controlling the degree to which a photoresist is exposed to illumination (e.g., time, intensity) can thus affect the fidelity of pattern transfer and resulting critical dimensions, patterning and/or registration error. For example, overexposure can create features that are smaller or narrower than desired (for a positive resist), while under-exposure can create features that are larger than desired.

The type of illumination utilized to transfer the image onto a wafer can also be controlled to affect patterning and critical dimensions. For instance, as feature sizes are driven smaller and smaller, limits are approached due to the wavelengths of the optical radiation. As such, that type of radiation and thus the wavelengths of radiation utilized for pattern transfers can be controlled to adjust patterning and critical dimensions and mitigate registration error. For instance, radiation having more conducive wavelengths (e.g., extreme ultraviolet (EUV) and deep ultraviolet (DUV) radiation having wavelengths within the range of 5–200 nm) can be utilized for lithographic imaging in an effort to accurately achieve smaller feature sizes. However, such radiation can be highly absorbed by the photoresist material. Consequently, the penetration depth of the radiation into the photoresist can be limited. The limited penetration depth requires use of ultra-thin photoresists so that the radiation can penetrate the entire depth of the photoresist in order to effect patterning thereof. The performance of circuits formed through photolithographic processing is, thus, also affected by the thickness of photoresist layers. The thickness of photoresist layers can be reduced through altering resist viscosity and/or employing a higher spin speed during coating.

In general, CMP employs planarization techniques wherein a surface is processed by a polishing pad in the presence of an abrasive or non-abrasive liquid slurry. The slurry employed reacts with the photoresist at the surface/subsurface range. Preferably the degree of reaction is not great enough to cause rapid or measurable dissolution (e.g., chemical etching) of the photoresist, but merely sufficient to cause a minor modification of chemical bonding in the photoresist adequate to facilitate surface layer removal by applied mechanical stress (e.g., via use of a CMP polishing pad). Thus, critical dimensions and registration can be affected by controlling the concentration, rate of flow and degree of abrasiveness of slurry applied during the CMP process as well as the amount of pressure applied between the polishing pad and wafer during the process.

Depending upon the resist system utilized, post exposure baking may also be employed to activate chemical reactions in the photoresist to affect image transfer. The temperatures and/or times that portions of the wafer are exposed to particular temperatures can be controlled to regulate the uniformity of photoresist hardening (e.g., by reducing standing wave effects and/or to thermally catalyze chemical reactions that amplify the image). Higher temperatures can cause faster baking and faster hardening, while lower temperatures can cause slower baking and correspondingly slower hardening. The rate and uniformity of photoresist hardening can affect critical dimensions, patterning and/or registration, such as, for example, by altering the consistency of a line width. Accordingly, time and temperature parameters can be controlled during post exposure baking to affect critical dimensions, patterning and/or registration.

Operating parameters of an etching stage can similarly be controlled to achieve desired critical dimensions and to mitigate registration error. After illumination, the pattern image is transferred into the wafer from the photoresist coating in an etching stage wherein an etchant, as well as other ingredients, are applied to the surface of the wafer by an excitation voltage or otherwise. The etchant removes or etches away portions of the wafer exposed during the development process. Portions of the wafer under less soluble areas of the photoresist are protected from the etchants. The less soluble portions of the photoresist are those portions that are not affected by the developer during the development process and that are not affected by the etchant during the etching process. These insoluble portions of the photoresist are removed in subsequent processing stage(s) to completely reveal the wafer and the pattern(s) formed therein. The concentration or electrical charge and energy of materials utilized in etching can thus be controlled to achieve desired critical dimensions, for instance, by affecting the accuracy with which selected portions of the wafer can be etched away.

Parameters relating to the type of template utilized to transfer an image onto a wafer can also be controlled to affect critical dimensions, layer to layer alignment and registration error. Where the template is a reticle, the pattern is transferred to only one (or a few) die per exposure, as opposed to where the template is a mask and all (or most) die on the wafer are exposed at once. Multiple exposures through a reticle are often performed in a step and scan fashion. After each exposure, a stage to which the wafer is mounted is moved or stepped to align the next die for exposure through the reticle and the process is repeated. This process may need to be performed as many times as there are die in the wafer. Thus, stepper movement can be controlled to mitigate registration error (e.g., by feeding fed forward and/or backward measurements to a stepper motor).

The pattern formed within the reticle is often an enlargement of the pattern to be transferred onto the wafer. This allows more detailed features to be designed within the reticle. Energy from light passed through the reticle can, however, heat the reticle when the image is exposed onto the wafer. This can cause mechanical distortions in the reticle due to thermal expansion and/or contraction of the reticle. Such distortions may alter the geometry of intricate features (e.g., by narrowing a line) and/or interfere with layer to layer registration to such a degree that a resulting circuit does not operate as planned when the image is transferred onto the wafer. Moreover, since the pattern is usually an enlargement of the pattern to be transferred onto the wafer, it typically has to be reduced (e.g., via a de-magnifying lens system) during the lithographic process. Shrinking an already distorted feature (e.g., a narrowed line) can have a deleterious effect on critical dimensions. Thus, while such a template may be effective to transfer more intricate pattern designs, it calls for highly accurate alignment and imaging to mitigate registration errors and maintain critical dimensions to within acceptable tolerances. Temperature controls can thus be employed to mitigate thermally induced mechanical distortions in the reticle.

Additionally, parameters relating to film growth or deposition components (e.g., producing metals, oxides, nitrides, poly, oxynitrides or insulators) can be controlled to achieve desired critical dimensions. Such films can be formed through thermal oxidation and nitridation of single crystal silicon and polysilicon, the formation of silicides by direct reaction of a deposited metal and the substrate, chemical vapor deposition (CVD), physical vapor deposition (PVD), low pressure CVD (LPCVD), plasma enhanced CVD (PECVD), rapid thermal CVD (RTCVD), metal organic chemical vapor deposition (MOCVD) and pulsed laser deposition (PLD). The rates of flow, temperature, pressures, concentrations and species of materials supplied during the semiconductor fabrication process can thus be controlled to govern film formation which bears on critical dimensions.

As mentioned above scanning electron microscope (SEM) or other techniques can be employed by the measurement system 1820 in accordance with one or more aspects of the present invention to determine what effect, if any, the various processing components are having on the fabrication process. Different structure or feature dimensions (e.g., height, width, depth) may, for example, be measured to generate different signatures that may be indicative of the effect that one or more processing components are having upon the fabrication process and which operating parameters of which processing components, if any, should thus be adjusted to rectify any undesirable processing. The processing components and/or operating parameters thereof may, for example, be able to be controlled based upon feedback/feed-forward information generated from the measurements. For example, at a first point in time a first signature may be generated that indicates that desired critical dimensions have not yet been achieved but are developing within acceptable tolerances, but that registration error is occurring. Thus, the process may be adapted in an attempt to mitigate registration error, but not affect developing critical dimensions. Then, at a second point in time a second signature may be generated that indicates that registration error is no longer occurring or is reduced, but that the desired critical dimensions still have not been achieved. Thus, on another wafer the process may be allowed to continue for a longer time when a corresponding signature indicates that the desired critical dimensions have been achieved without the occurrence of registration error.

It will be appreciated that the measurement system 1820 can reside in one physical or logical device (e.g., computer, process) and/or be distributed between two or more physical or logical devices. The measurement system includes one or more non-destructive measurement components adapted to take readings of the test structures. The measurement system is operatively coupled to the control system that can be configured in any suitable manner to control and operate the various components within the system in order to carry out the various functions described herein. For example, the control system 1816 may provide one or more signals to the measurement system to control at least some of the operations of the measurement system 1818. Similarly, the control system 1816 is adapted to receive signals from the measurement system indicative of readings taken thereby. Such readings may, for example, be related to critical dimensions, conductivity, resistivity, etc. of the test structures.

In the example shown, the control system 1816 includes a processor 1828, such as a microprocessor or CPU, coupled to a memory 1830. The processor 1828 can be any of a plurality of processors, and the manner in which the processor 1828 can be programmed to carry out the functions relating to the present invention will be readily apparent based on the description provided herein. The memory 1830 included within the control system 1816 serves to store, among other things, program code executed by the processor 1828 for carrying out operating functions of the system as described herein. The memory 1830 may include read only memory (ROM) and random access memory (RAM). The ROM contains among other code the Basic Input-Output System (BIOS) which controls the basic hardware operations of the system 1800. The RAM is the main memory into which the operating system and application programs are loaded. The memory 1830 may also serve as a storage medium for temporarily storing information such as, for example, tabulated data and algorithms that may be employed in carrying out one or more aspects of the present invention. The memory 1830 can also serve as the data store 1826 and can hold patterns against which observed data can be compared as well as other data that may be employed in carrying out the present invention. For mass data storage, the memory 1830 may include a hard disk drive, for example.

It will be appreciated that the control system, and more particularly the processor, may be operatively coupled to a fabrication component driving system (not shown) that drives the fabrication components 1818. The processor 1828 would control the fabrication component driving system to selectively control one or more of the fabrication components 1818 and/or one or more operating parameters associated therewith as described herein. The processor 1828 monitors the process and selectively regulates the fabrication process by controlling the corresponding fabrication components 1818. Such regulation can facilitate controlling critical dimensions and mitigating mis-patterning and registration error during fabrication and can further facilitate initiating a subsequent fabrication phase with more precise initial data, which facilitates improved chip quality at higher packing densities It will be further appreciated that training techniques can be implemented in accordance with one or more aspects of the present invention. For example, such techniques can be utilized to populate the data store 1826 (which may be comprised within the memory 1830) for use in subsequent monitoring. For example, readings taken by the measurement system can be utilized (e.g., by the processor) to generate substantially unique signatures that can be stored in the data store 1826. The data store 1826 can be populated with an abundance of signatures, for example, by examining a series of wafers and/or wafer dies. Such signatures can, for example, be compared to values obtained by the measurement system to generate feed forward/backward control data that can be employed in regulating the fabrication process. It is to be appreciated that the data store 1826 can store data in data structures including, but not limited to one or more lists, arrays, tables, databases, stacks, heaps, linked lists and data cubes. Furthermore, the data store 1826 can reside on one physical device and/or may be distributed between two or more physical devices (e.g., disk drives, tape drives, memory units).

It will be still further appreciated that intelligent software can be utilized to detect process margin where spaces, lines and/or other features disappear or deviate on corresponding die. Process margin of one or more die on or about the center of the wafer can, for example, be compared to process margin of one or more die on or near an edge of the wafer to determine process margin differences across the wafer. Similarly, process margin at one location (e.g., center) of one wafer can be compared to process margin at corresponding locations on other (e.g., subsequently processed) wafers. A determination can then be made as to whether process margin is drifting from wafer to wafer. This can also be done from lot to lot to determine process drift over time.

Figure 19:
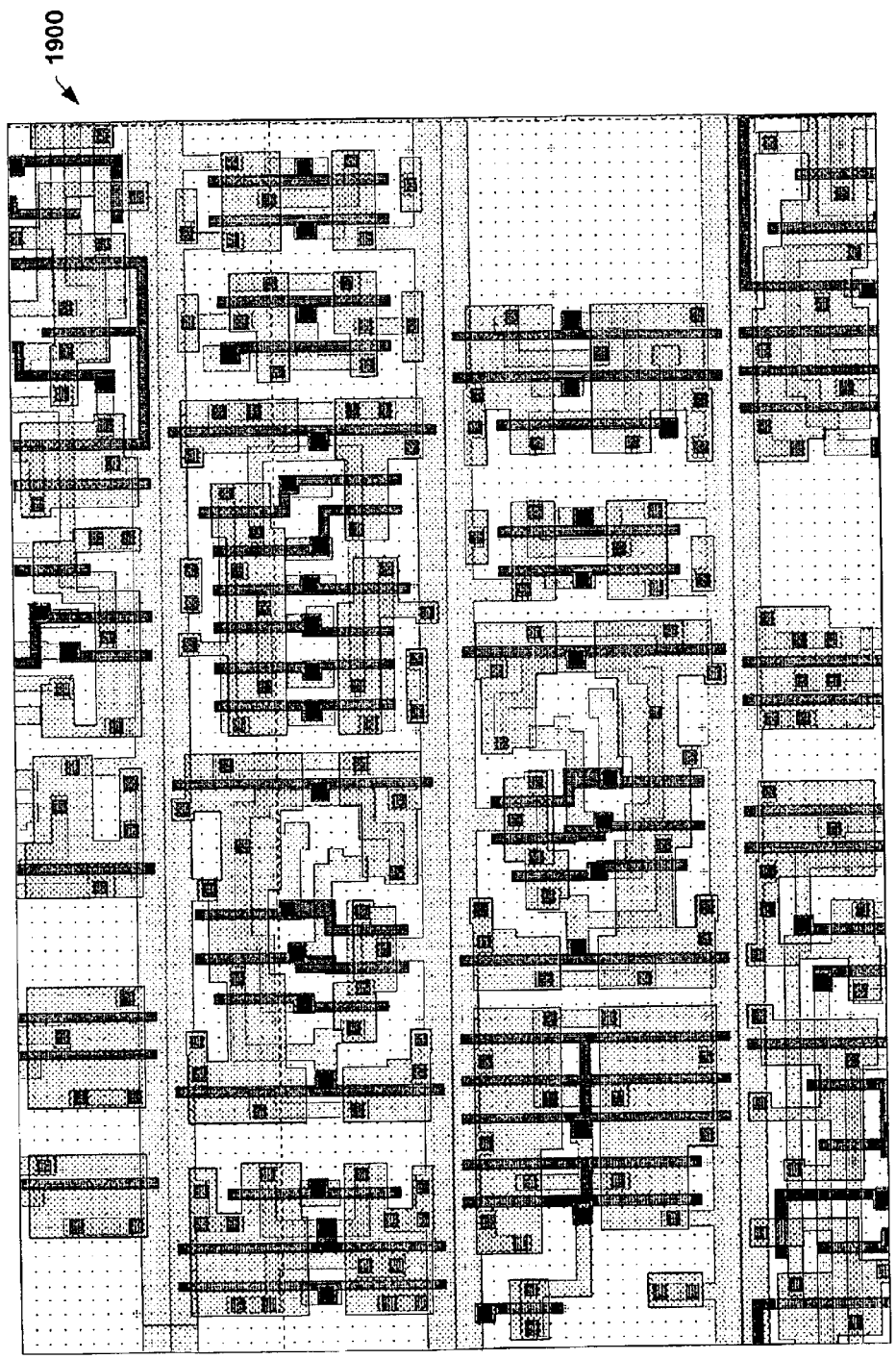
FIG. 19 is a schematic diagram of a random section of a test module having a plurality of test structures formed therein in accordance with one or more aspects of the present invention.
Figure 20:
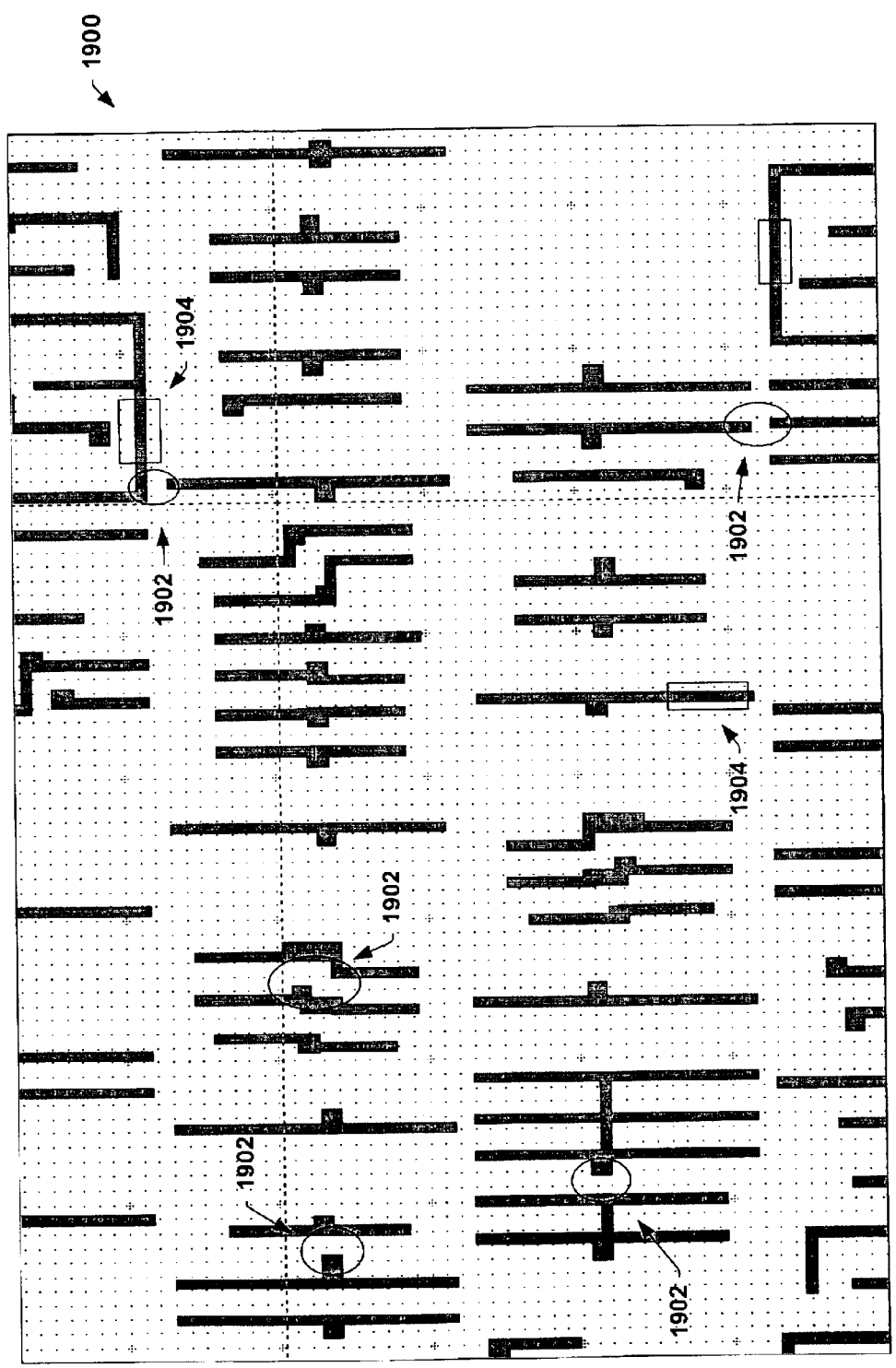
FIGS. 20–22 are schematic diagrams similar to that shown in FIG. 19 wherein potential problem areas are identified.
Figure 21:
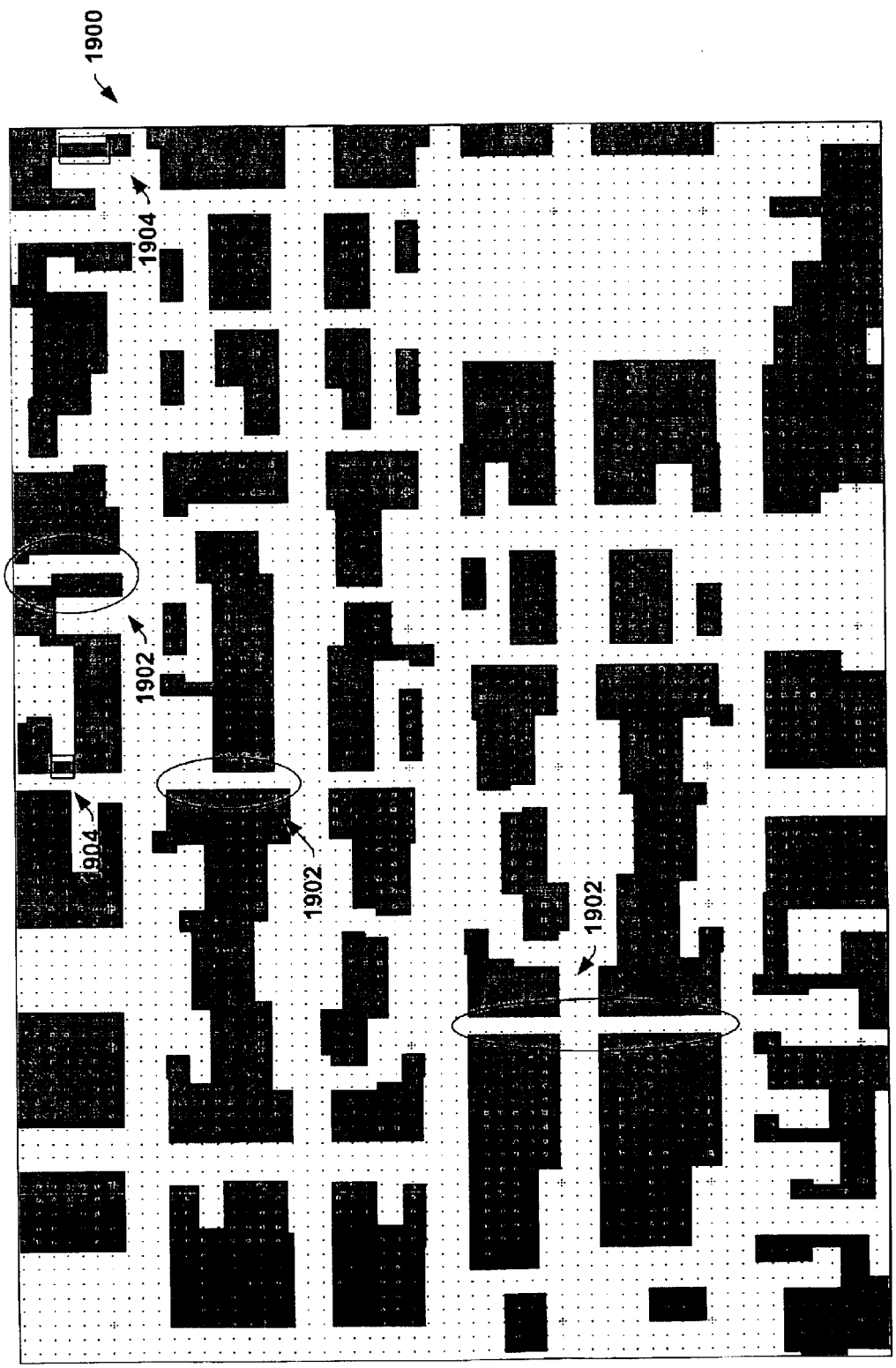
Figure 22:
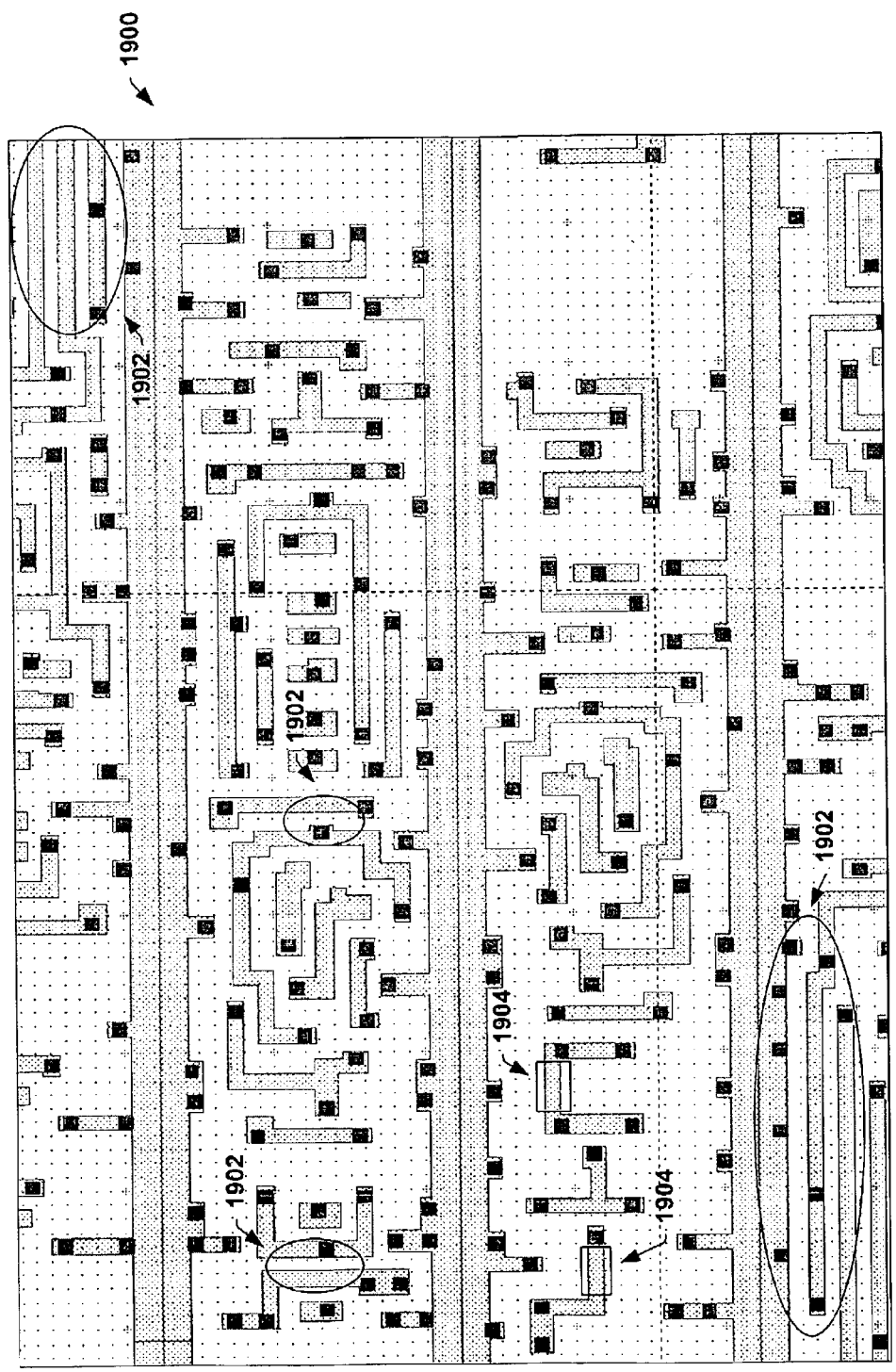

FIG. 19 is a schematic diagram of a random section of a test module 1900 having a plurality of test structures formed therein in accordance with one or more aspects of the present invention. FIGS. 20–22 are similar schematic diagrams wherein some areas 1902 of a wafer that may exhibit problems if relevant structures are exposed to process drift are encircled in an ellipse. For example, if the geometry of those structures is increased, bridging may occur as gaps that separate the structures are reduced to accommodate additional material. Similarly, some areas 1904 that may exhibit problems if relevant structures are downsized are highlighted by enclosure within a rectangle.

With reference now to FIG. 23, a methodology 2300 is illustrated for fashioning and utilizing a test module to monitor for process drift and/or other aberrant behavior in a semiconductor fabrication process in accordance with one or more aspects of the present invention. Although the methodology 2300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, any methodologies according to the present invention may be implemented, to varying degrees, in association with the formation and/or processing of structures that may or may not be illustrated and described herein.

The methodology begins at 2302 wherein a plurality of test modules are formed within a plurality of die on a test wafer. The test modules, themselves, include a plurality of test structures or test elements. The test modules can, for example, have hundreds of different types of structures and/or feature combinations located thereon. It will be appreciated that the test structures (and thus the test modules) can be sized according to or in increments of design rules. Design rules for a particular device or integrated circuit may, for example, dictate that a particular structure or feature within the device is to have a certain dimension (e.g., thickness, width) to ensure that the device performs with a desired reliability.

The test structures of a first test module on a die can thus be formed according to one hundred percent of the design rules. The test structures of a second test module on the die can be formed according to ninety seven percent of the design rules. And, the test structures of a third test module on the die can be formed according to ninety seven percent of the design rules, etc. It will be appreciated, however, that these figures are exemplary only and that the test structures (and thus the test modules) can be sized according to any variations of design rules. For example, the test structures can be sized so that one or more of them exceed one hundred percent of the design rules. Sizing the test structures can enhance sensitivity and facilitates finding those features that are prone to failures (e.g., shorts or opens) due to variations in processing conditions, such as alignment, layer thickness/ width, layer flatness, layer (non) uniformity, illumination intensity, focus control, degree of focus, developer conditions, etch characteristics (e.g., composition), etc.

The methodology then proceeds to 2304 wherein the test structures within the test modules are inspected and compared. A scanning electron microscope can, for example, be utilized to inspect the structures. A measured value of a test structure or feature in one die can then be compared to a measured value of the same test structure or feature in an adjacent die. If there is a substantial difference or a difference that corresponds to a predefined standard, then this may be an indication that this particular test structure is sensitive to the instant operating conditions. By way of further example, an inspection tool can be utilized to interrogate a first test structure on a first test module located on a first die. The same test structure on a similar test module located on a second die can similarly be inspected. This can be done for any number of structures on any number of test modules located on any number of die. Measured values of the same structures taken from similar test modules located on different die can then be compared to determine sensitivity of test structures to operating conditions. More particularly, one or more differences in these values may be indicative of a structure that is sensitive to changes in processing conditions, process drift or production abnormalities.

At 2306, based upon the foregoing comparisons and determinations, a collection or subset of features or elements that are highly sensitive to process variations and that are dimensioned so as to have an increased sensitivity is generated. It will be appreciated that the particular makeup of the subset of features may be dependent upon the process under which the test structures were analyzed. For example, a PMOS process may yield a subset of features different than that produced by an embedded memory process because different processes operate under different conditions. Accordingly, the test structure may be developed under controlled variations in processing conditions to provide a mechanism that is sensitive to particular types of fabrication processes. Thus, detected changes in these subsets may be indicative of process drift in particular processing conditions inherent to particular types of semiconductor fabrication processes.

Additionally, it will be appreciated that since the subset comprises less than all of the features in original test modules and may be determined utilizing features having dimensions smaller than those corresponding to an original design rule, the size of the subset of features may be small enough to be formed within a scribe line or other unused available space (e.g., "white space") within a production wafer (e.g., on a die, between die, between elements within a die) to monitor for process drift. The subset of test features would thus have its own set of design rules that are smaller than production design rules to expose process variations or drift.

Accordingly, at 2308 relevant subset test modules are incorporated into unused or white spaces within a production wafer. At 2310, the test structures within the subset test modules are then inspected and compared to one another to determine if process drift is occurring. Depending upon the type of structures that are affected, the particular fabrication stage (e.g., alignment, illumination) that is drifting or otherwise exhibiting aberrant behavior may be able to identified and monitored at 2312. The troublesome stage(s) may then be adjusted as is necessary at 2314 to rectify the situation.

From the foregoing it will be appreciated that one or more aspects of the present invention can be utilized to assess existing process flows for pattern anomalies, identify process drift, and/or the effects of material substitutions, etc. and thereby facilitate a reduction in and/or streamlining of the number and/or duration of semiconductor fabrication processing steps, so as to increase product throughput and reduce product cost. Aspects of the present invention may also serve to maintain the integrity of the processing steps so that semiconductor fabrication processes are carried out within acceptable operating parameters to facilitate device fabrication in accordance with design rules. Such design rules may, for example, dictate particular characteristics to which the devices can be made to ensure certain predetermined performance characteristics. For example, the design rules for a particular device may dictate that a feature or element within the device is to have a particular dimension (e.g., thickness, width) to ensure that the device performs with a desired reliability.

Although the invention has been shown and described with respect to one or more implementations, equivalent alterations and/or modifications may be evident based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fashioning one or more test modules suitable for implementation with a semiconductor fabrication system to monitor for semiconductor fabrication process drift, comprising:

forming one or more test modules in die on a test wafer, respective test modules in different die including similar sets of test structures;

inspecting one or more of the test structures in one or more of the test modules on one or more of the die;

comparing inspected test structures of one or more die to corresponding test structures in one or more other die;

determining whether differences exist between the inspected corresponding test structures; and generating one or more subset test modules comprising inspected structures that differed from die to die according to one or more predetermined criteria, thus indicating a sensitivity to process drift or changes in processing conditions.

2. The method of claim 1, further comprising:
utilizing one or more of the subset test modules to determine process drift by:
incorporating one or more of the subset test modules within a production wafer undergoing the fabrication process,
monitoring one or more structures within one or more of the subset modules,
comparing corresponding structures from one or more subset modules to another and
determining that process drift may be occurring where corresponding structures vary between one or more subset modules.

3. The method of claim 2 wherein the subset modules are designed in a fashion so as to facilitate an identification of which processing conditions are drifting, the method further comprising:
identifying which processing conditions are drifting; and
adjusting the identified process conditions to mitigate the drift.

4. The method of claim 2, wherein different structures within the test modules are designed so as to be more sensitive to particular processing conditions, thus facilitating one or more subset modules that enable selective identification of processing conditions that may be drifting.

5. The method of claim 4, wherein the structures are dimensioned or configured to have a heightened sensitivity to particular processing conditions.

6. The method of claim 1, wherein inspecting one or more test structures comprises utilizing a scanning electron microscope.

7. The method of claim 1, wherein the test structures are formed according to design rules.

8. The method of claim 7, wherein the test structures are formed in increments of about three percent of design rules.

9. The method of claim 2, wherein the subset modules are small enough to be incorporated within scribe lines within the production wafer and/or within white spaces within die on the production wafer.

10. The method of claim 1, further comprising:
utilizing one or more of the subset test modules to determine process drift by:
incorporating one or more of the subset test modules within one or more production wafers undergoing the fabrication process,
monitoring one or more structures within one or more of the subset modules,
comparing corresponding structures from one or more subset modules to another and
determining at least one of that process drift may be occurring across one or more of the production wafers, that process drift may be occurring from wafer to wafer and that process drift may be occurring from one wafer lot to one or more other wafer lots.

11. A method of monitoring a semiconductor fabrication process for drift, comprising:
forming one or more test modules in die on a test wafer, the respective test modules including similar sets of test structures;
inspecting one or more of the test structures in one or more of the test modules on one or more of the die;
comparing inspected test structures of one or more die to corresponding test structures on one or more other die;
determining whether differences exist between the corresponding test structures;
generating one or more subset test modules comprising structures that vary from die to die, thus indicating a sensitivity to process drift or changes in processing conditions;
incorporating one or more of the subset test modules within a production wafer undergoing the fabrication process;
monitoring one or more structures within one or more of the subset modules; comparing corresponding structures from one or more subset modules to another; and
determining that process drift may be occurring where corresponding structures vary between one or more subset modules.

12. The method of claim 11, wherein inspecting one or more test structures comprises utilizing a scanning electron microscope.

13. The method of claim 11, wherein the test structures are formed according to design rules.

14. The method of claim 13, wherein the test structures are formed in increments of about three percent of design rules.

15. The method of claim 11, wherein the subset modules are small enough to be incorporated within scribe lines within the production wafer and/or within white spaces within die on the production wafer.

* * * * *